United States Patent [19]
Maruyama et al.

[11] Patent Number: 5,327,371
[45] Date of Patent: Jul. 5, 1994

[54] INFORMATION RECORDING AND REPRODUCING APPARATUS

[75] Inventors: Yooji Maruyama, Iruma; Yoshito Tsunoda, Suginami; Ryo Imura, Tokorozawa; Kazuhisa Fujimoto, Kodaira, all of Japan

[73] Assignee: Hitachi, Ltd., Tokyo, Japan

[21] Appl. No.: 837,634

[22] Filed: Feb. 14, 1992

[30] Foreign Application Priority Data

Feb. 21, 1991 [JP] Japan ................... 3-027088
Feb. 21, 1991 [JP] Japan ................... 3-027090
Aug. 23, 1991 [JP] Japan ................... 3-211876

[51] Int. Cl.$^5$ ............................... G11C 19/08
[52] U.S. Cl. ............................ 365/1; 365/29
[58] Field of Search .................... 365/1, 2, 29, 87

[56] References Cited

U.S. PATENT DOCUMENTS

| | | | |
|---|---|---|---|
| 4,156,934 | 5/1979 | Burford et al. | 365/2 |
| 4,287,568 | 9/1981 | Lester | 365/1 |
| 4,310,897 | 1/1982 | Lazzari | 365/1 |
| 4,583,200 | 4/1986 | Konishi et al. | 365/29 |
| 4,754,429 | 6/1988 | Kashiro et al. | 365/1 |
| 5,056,145 | 10/1991 | Yamamoto et al. | 381/51 |

FOREIGN PATENT DOCUMENTS

| | | | |
|---|---|---|---|
| 55-28585 | 2/1980 | Japan | 365/1 |
| 59-101092 | 6/1984 | Japan . | |
| 59-193594 | 11/1984 | Japan . | |
| 59-207011 | 11/1984 | Japan . | |
| 61-162889 | 7/1986 | Japan . | |
| 61-239487 | 10/1986 | Japan . | |
| 61-248296 | 11/1986 | Japan . | |
| 62-124690 | 6/1987 | Japan . | |
| 63-144487 | 6/1988 | Japan . | |

OTHER PUBLICATIONS

Research Disclosure, Nov. 1981, No. 211, p. 420, "A Solid-State Mass Data Storage System", by H. P. Baumeister.

Nikkei Electronics Magazine, Nov. 26, 1990, pp. 116-136.

*Primary Examiner*—Joseph A. Popek
*Attorney, Agent, or Firm*—Fay, Sharpe, Beall, Fagan, Minnich & McKee

[57] ABSTRACT

An information recording and reproducing apparatus which has a memory portion which uses the Bloch lines occurring at the magnetic domain walls at the periphery of magnetic domains present in magnetic garnet films as the information carrier, a drive portion to write information into or read information from the said memory portion, and in which the memory portion is constructed to be connectable to and disconnectable from the drive means, wherein the signal transfer is carried out via a connection means when the said memory portion is set in the drive portion. In this information recording and reproducing apparatus, since the recording portion can be freely connected to or disconnected from the drive portion, it is possible to selectively insert portable substrates storing different information in the same apparatus body portion.

24 Claims, 16 Drawing Sheets

INFORMATION RECORDING AND REPRODUCING APPARATUS

BACKGROUND OF THE INVENTION

The present invention relates to Bloch line memory devices, and in particular, to Bloch line memory devices that are suitable for use as memory apparatuses in small sized and light weight information processing equipment.

A Bloch line memory element stores information using Bloch line pairs which are microscopic magnetization structures that are generated in the magnetization structures called magnetic domain walls which are the periphery of magnetic domains that are present in magnetic films. Since the size of a Bloch line pair is about 1/10th of the width of the magnetic domain in which it is present, Bloch line pairs can offer memory densities of about an order of magnitude greater than the conventional magnetic storage devices that store information by the presence or absence of magnetic domains. If the memory density increases, it will be possible to store more information in a limited space and hence it will be possible to realize a memory device that is superior in economy and ease of handling. The basic construction and principle of operation have been described in, for example, U.S. Pat. No. 4,583,200, Japanese Patent Laid-Open No. 59-101092, etc. Further, the circuit configuration for driving such memory elements has been described in Japanese Patent Laid-Open No. 59-207011 and Japanese Patent Laid-Open No. 59-193594, etc. According to these descriptions, in order to drive a Bloch line memory element, a magnetic field generation means (coil, permanent magnet, etc.,) and the memory element are assembled in a single module which is mounted on the circuit substrate. In addition, active devices are mounted on this circuit substrate for supplying electric power to the coil. The appropriate memory operation in such a configuration was being realized by generating a magnetic field due to the electric power supplied to the coil from the active device and causing the movement of Bloch line pairs in the memory element by the magnetic field so generated.

The line shaped magnetic domains called stripe domains that constitute such a memory element are arranged by groove patterns, etc., as described in Japanese Patent Laid-Open No. 61-239487, etc. As described in this Japanese Patent Laid-Open, if a magnetic field (bias magnetic field) of more than a specific strength is applied from outside in the direction perpendicular to the magnetic garnet film, the edges of the stripe domain move in the direction to reduce the length of the stripe domain. If a groove pattern is provided within the stripe domain at this time, a repulsive force will be generated by the groove pattern on the ends of the stripe domain so that it will be possible to suppress the shrinking of the stripe domain. If the shrinking force and the repulsive force from the groove pattern can be balanced with each other due to this bias magnetic field, the length of the stripe domain can be maintained to be almost equal to the length of the groove pattern (thereby fixing the magnetic domain) even if a stray magnetic field from the outside acts on the device. Because of this function, it is possible to match the positions of the different conductor patterns and stripes required for memory operation.

In a Bloch line memory element, it is necessary to make the Bloch line pairs propagate to a specific address in order to record information and to input or output the necessary information. During propagation, a magnetic field is applied to in the direction that causes the stripe magnetic domain to shrink. At this time, it is necessary to maintain the length of the stripe magnetic domain so that is does not become shorter than necessary. In the conventional art, groove patterns were also being used for preventing this excessive shrinking of the stripe magnetic domains.

The required operation could be made by using groove patterns for fixing the stripe magnetic domains forming the Bloch line memory element thereby realizing the memory operation. Other methods have been known that have functions equivalent to this groove pattern, such as using ring shaped groove patterns described in Japanese Patent Laid-Open No. 61-248296, using magnetic garnet films with saw tooth shaped cross-section described in Japanese Patent Laid-Open No. 61-162889, or using a pattern produced by ion implantation described in Japanese Patent Laid-Open No. 62-124690, etc. In all these methods, since a fixing force is generated on the stripe magnetic domains, the required objective is achieved by balancing it with the bias magnetic field.

Further, until now, Bloch line memory devices had only the function of a simple memory device. Therefore, it was necessary to connect an external information processing equipment to process the stored information in a manner suitable for the recent trends of paperless or mediumless information distribution (as described in pages 116-136 of Nikkei Electronics Magazine of Nov. 26, 1990).

In the above described conventional art, sufficient considerations have not been given to the possibilities of attaching and detaching the Bloch line memory element with the information processing equipment in which it is used. In other words, since the Bloch line memory element and the drive circuit are formed on the same circuit substrate, it is not possible to separate out the expensive drive circuit at the time of attaching and detaching the Bloch line memory element from the information processing equipment. As a result, it is not possible to provide several circuit substrates that can be replaced due to problems of economy.

Further, in the conventional art, the Bloch line memory element is assembled in the module along with the driving coil. As a result, the thickness of the circuit substrate becomes at least about 1 cm. Consequently, it is inconvenient to be used as an external memory device in small sized and light weight equipment as compared to semiconductor (IC) cards or floppy disks, etc.

In addition, there are problems in the configuration of the memory elements also. As has already been explained above, since the stripe magnetic domains are fixed in the conventional art, it is necessary to apply a bias magnetic field to balance out the repulsive force from the fixing pattern. Therefore, it is necessary to continue to apply the bias magnetic field at all times while the information is being stored (that is, at all times other than during input and output). This is explained here in specific terms using FIG. 13a, FIG. 13b, and FIG. 13c. FIGS. 13a to 13c show an example of the method of fixing the magnetic domain using the groove patterns described in Japanese Patent Laid-Open No. 63-144487 which comprises the first groove patterns 210 that fix the magnetic domains and the second groove patterns 211 that act as a guide when the magnetic domains stretch, with these groove patterns being formed on the magnetic garnet film 220. In the condition in which the bias magnetic field has been applied as shown in FIG. 13a, the stripe magnetic domains 203 will be fixed around the first groove patterns 210. However, when the bias magnetic field is shut off as shown in FIG. 13b, the stripe magnetic domains stretch and become longer than the first groove patterns. At this time, since the ends of the stripe magnetic domains extend beyond the area containing the recording patterns (the area indicated by the arrow n), it will not be possible to transfer information. Also, if the stripe magnetic domains stretch too much, there is the danger of destroying other memory loops. Therefore, in the conventional art, the method of controlling the length of the stripe magnetic domain to be within a specific range by applying a certain amount of the bias magnetic field at all times. Further, FIG. 13c is a cross-sectional diagram that shows the state of magnetization at the cross-section B—B' in FIG. 13a.

The method of using a permanent magnet described in Japanese Patent Laid-Open No. 59-193594 is also known as a method of applying the bias magnetic field. According to this method, since a constant bias magnetic field is obtained from the permanent magnet, it will be possible to realize stable device operation. However, in this method, since it is necessary to place the permanent magnet over the memory element, the thickness of the module will increase.

Following the demands for small size and light weight of information processing equipment in the recent years, it is necessary to reduce the size and thickness of Bloch line memory devices. However, in the conventional Bloch line memory elements, since the module which is the minimum configuration for operating the element is thick, it is not possible to make the memory device think or to improve its capacity to be attached and detached easily.

Further, an external equipment having processing functions has to be connected to the conventional memory device in order to reproduce or select the information. As a consequence, several equipment will be needed to realize the functions required in paperless or mediumless information distribution systems thereby causing problems in ease of handling and portability.

SUMMARY OF THE INVENTION

The object of the present invention is to provide an external memory device having the economy comparable to IC cards by disclosing a device configuration and memory configuration suitable for realizing the ease of attachment and detachment of Bloch line memory devices. Also, it is the object of the present inventions to provide an information storage device that is appropriate for the trends of paperless and mediumless information distribution systems.

In order to achieve the above object, the present invention has the following features. These features are:

According to one aspect of the present invention, an information recording and reproducing apparatus is provided which comprises a memory means which uses the Bloch line pairs occurring in the magnetic domain walls at the periphery of magnetic domains present in magnetic films as the information carrier, a drive means to write information into or to read information from the memory means, a connection means to transmit signals between the memory means and the drive means, wherein the memory means can be attached to or detached from the drive means. The magnetic film, which is typically a magnetic garnet film, has an easy magnetization axis almost perpendicular to its surface. The drive means comprises coils, permanent magnets, magnetic circuits, and drive circuits, etc. A connection means is required for the exchange of signals or electric power between the memory means and the drive means. For the connection means, it is possible to use electrical coupling using electrical contacts provided in both the memory means and the drive means, or optical coupling using light emitting and light receiving elements, or magnetic coupling using electromagnetic induction circuits, or wired or wireless transceivers, etc. By adding power supply circuits to the electromagnetic induction circuits, it is possible to supply electric power without contacts from the drive means to the memory means. In addition, although it is preferable to use digital signals for the transmission and reception of signals, it may be preferable to carry out the input and output of information after D/A or A/D conversion, depending on the need. Further, it is possible to combine several of these forms of connection means.

According to a limited aspect of the present invention, the memory means is provided as an information recording and reproducing apparatus which has the external shape of a card. Here, the card has a thickness in the range 1 mm to 10 mm and a length and a width of 86 mm and 54 mm, respectively.

According to another limited aspect of the present invention, an information recording and reproducing apparatus is provided in which the memory means comprises a memory portion which stores information by the presence or absence of Bloch line pairs, and a semiconductor circuit portion for outputting to the memory portion the semiconductor signals necessary for the writing operation or the reading operation. In this semiconductor circuit portion, it is possible to realize the function of selecting the signal line to the memory portion and to connect or disconnect that line. Also, according to this configuration, it is possible to input or output the data with the address information and memory control signals between the memory portion and the drive means.

According to yet another limited aspect of the present invention, an information recording and reproducing apparatus is provided in which the memory means (memory portion) is covered by a magnetic shielding means. It is possible to protect the memory portion from stray magnetic fields using this magnetic shielding means. It is also preferable to make this magnetic shielding means consisting of a magnetic film attachable and detachable to the memory means.

According to yet another limited aspect of the present invention, an information recording and reproducing apparatus is provided in which a linear raised ferrite is placed at a position at least overlapping the Bloch line memory element (the memory portion) mounted on the circuit substrate (the memory means) and makes the distribution of the magnetic field driving the memory element uniform and averages the strength of the magnetic field. A ferrite slab of thickness of about 0.2 mm to 1 mm is commonly used as the linear raised ferrite.

According to yet another limited aspect of the present invention, an information recording and reproducing apparatus is provided in which the positioning means for the stripe magnetic domain forming the memory loop in the memory portion contains patterns formed either within or upon the magnetic garnet film, with these patterns consisting of a first pattern provided either within or at least overlapping the stripe magnetic domains and a second pattern provided between the first pattern and the neighboring stripe magnetic domains.

According to yet another limited aspect of the present invention, an information recording and reproducing apparatus is provided in which the width of the second pattern is made larger at the ends of the stripe magnetic domains.

According to yet another limited aspect of the present invention, an information recording and reproducing apparatus is provided with the function of preventing the stretching of the ends of the stripe magnetic domains when the bias magnetic field applied in a direction perpendicular to the magnetic film is in the range −100 to 100 Oe. Among the forms particularly suitable for this, the first form is making the width of the second pattern wider at the ends of the stripe magnetic domains, and the second form is providing a perpendicularly magnetized film on the entire memory element.

In the present invention, the pattern for positioning the stripe magnetic domains is not limited to the above described patterns but the first and second patterns may be groove patterns formed by etching the magnetic film. The patterns can also be magnetic material formed on top of the magnetic film. Further, they can also be formed by non-magnetic material within the magnetic film.

According to yet another limited aspect of the present invention, an information recording and reproducing apparatus is provided in which a perpendicularly magnetized film is provided on the entire surface of the memory portion (the Bloch line memory element).

According to yet another limited aspect of the present invention, an information recording and reproducing apparatus is provided in which a longitudinal magnetic film is provided on the entire surface of the memory portion.

According to yet another limited aspect of the present invention, an information recording and reproducing apparatus is provided in which the drive means is provided with output means such as speakers, earphones, or headphones, etc.

According to yet another limited aspect of the present invention, an information recording and reproducing apparatus is provided in which the drive means is provided with a display means for visually displaying the information. Using this display means, it is possible to display the information in the form of an image or character information.

According to yet another limited aspect of the present invention, an information recording and reproducing apparatus is provided in which are included an information selection circuit for selecting the required information from the information stored in the memory means, a digital to analog converter circuit for converting the information stored as digital information in the memory means into analog information, an amplifier circuit for amplifying the output of the digital to analog converter circuit, and an audio reproduction circuit for outputting the signal from the amplifier circuit in the form of sound signals. Therefore, the stored information can be reproduced as sound by coupling with the card type memory circuit substrate (the memory means).

According to yet another limited aspect of the present invention, an information recording and reproducing apparatus is provided in which are included an information selection circuit for selecting the required information from the information stored in the memory means, a digital to analog converter circuit for converting the information stored as digital information in the memory means into analog information, an amplifier circuit for amplifying the output of the digital to analog converter circuit, and a video reproduction circuit for outputting the signal from the amplifier circuit in the form of visual display of images, etc. Therefore, by coupling with the card type memory circuit substrate (the memory means), the stored information can be reproduced as images or character information.

DETAILED DESCRIPTION OF THE INVENTION

Figure 1:
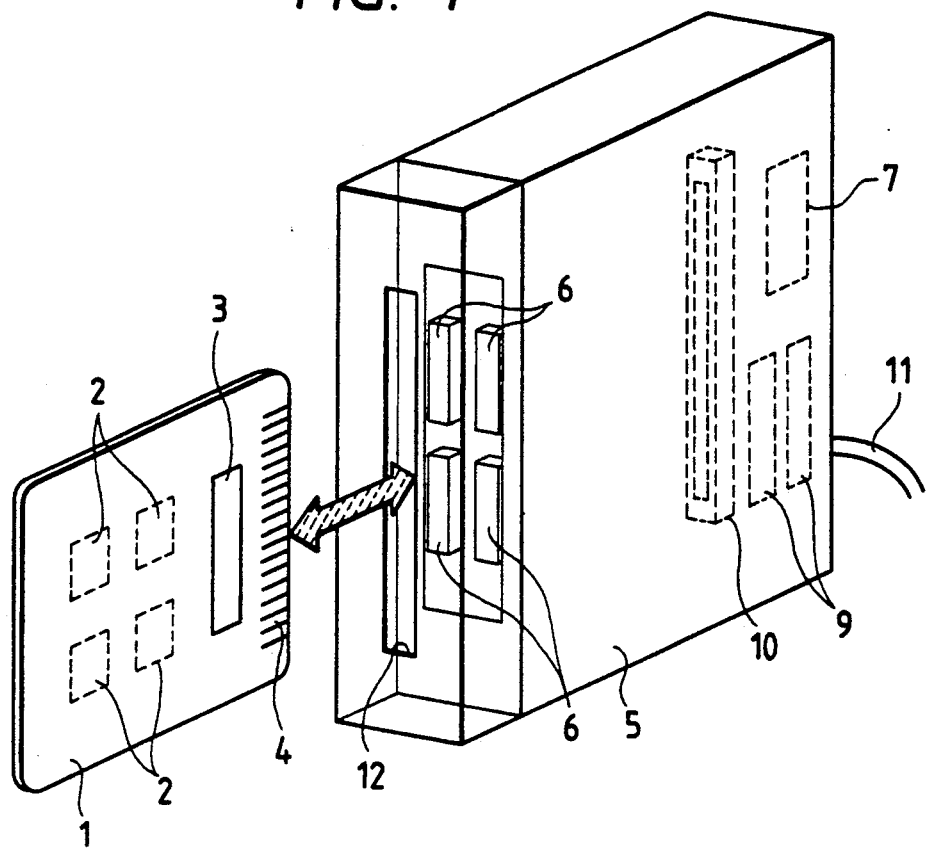
FIG. 1 is the schematic diagram showing one of the preferred embodiments of the Bloch line memory device of the present invention.

The present invention is described below in detail using FIGS. 1, etc.

In each of the following figures, the same numeral refers to the same constituent element. For example, the memory means is the one in which the Bloch line memory element 2 constituting the memory portion is mounted on the card shaped circuit substrate 1. Electrical contacts 4 are provided at the edge of the circuit substrate. This electrical contacts 4 can be connected to and disconnected from the connector 10 within the memory apparatus body portion and the two together constitute the connection means. Due to this connection, the electrical signals, the control signals, or the current required for the operation of the element can be transferred from the apparatus body portion 5 which constitutes the drive means to the circuit substrate 1. During the connection, the drive means (coil, magnetic circuit, and permanent magnet) 6 within the apparatus body portion 5 will be in such a position as to grip the Bloch line memory element. Because of this, it is possible to apply the magnetic field generated in the drive means very efficiently to the memory element. Since the drive means is not included in the circuit substrate 1, it is possible to make the thickness of the circuit substrate 1 almost as thin as the memory element 2. Also, since the drive means 6 does not contain the circuit substrate, it will be possible to manufacture the circuit substrate 1 at a low cost.

Since the circuit substrate 1 and the apparatus body portion can be connected and disconnected with each other using the connector 10 which is the connection means, it will be possible to handle a number of circuit substrate 1 by the same apparatus body portion 5. Because of this, the ease of handling of the same level as that of IC cards can be achieved.

By mounting the Bloch line memory element, the semiconductor circuits, and the photo-semiconductor element on the same circuit substrate, it will be possible to convert the optical signals from the body portion unit into electrical signals via the photo-semiconductor element and the semiconductor circuits and then transmit this electrical signal to the Bloch line memory element. In this case, since the body portion unit and the card type substrate are coupled optically, it will be possible to detach the card type substrate.

By mounting the Bloch line memory element, the semiconductor circuits, and the electromagnetic induction circuit on the same circuit substrate, it will be possible to convert the magnetic signals from the body portion unit into electrical signals via the electromagnetic induction circuit and the semiconductor circuits and then transmit this electrical signal to the Bloch line memory element. The electromagnetic induction circuit can be realized by existing inductance circuits. In this case, since the body portion unit and the card type substrate are coupled magnetically, it will be possible to detach the card type substrate.

By providing an electromagnetic induction circuit and a power supply circuit in the card type substrate on which the Bloch line memory element and the semiconductor circuits are mounted, it is possible to convert the magnetic energy from the body portion unit into electrical energy and supply this electrical energy to the Bloch line memory element and the semiconductor circuits on the card type substrate. The power supply circuit can be realized by the conventional transformer circuit. In this case, since the body portion unit and the card type substrate are coupled magnetically, it will be possible to detach the card type substrate.

Figure 2:
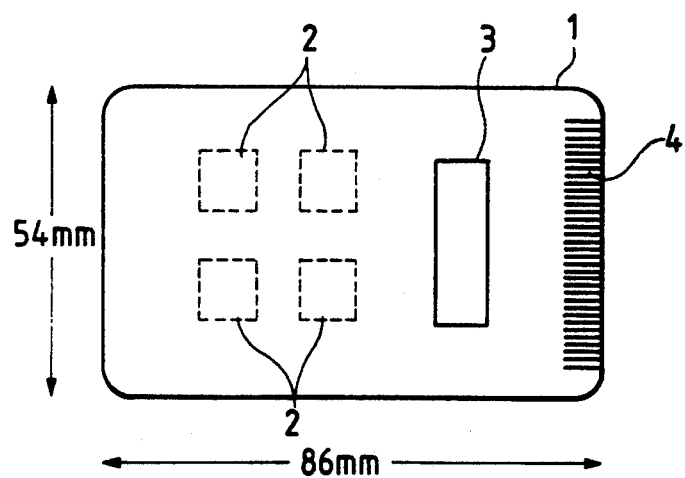
FIG. 2 is the plan view showing the construction of the circuit substrate in one of the preferred embodiments of the present invention.

By making the size of the circuit substrate equal to the size shown in FIG. 2 (length about 86 mm, width about 54 mm, and thickness of about 1 mm to 10 mm), it is possible to achieve the same level of ease of handling as that of IC cards.

It is very important to provide semiconductor circuits on the circuit substrate. By selectively switching the signal lines from the Bloch line memory element using these semiconductor circuits, it is possible to transmit time-sequentially a large amount of data over a single line. Because of this, it will be possible to make a number of signal lines share the electrical contacts 4 on the circuit substrate 1. Consequently, the total number of electrical contacts 4 can be reduced substantially compared to the total number of pins in the Bloch line memory element. Because the number of electrical contacts 4 can be reduced, it will be possible provide in a limited area (on the circuit substrate 1) the electrical contacts 4 with the area necessary for obtaining secure electrical connection. This is a particularly important feature in the present invention in which the memory means and the drive means are separated.

By realizing the input and output of address information and data, and the control signals necessary for realizing the memory functions between the card type circuit substrate 1 and the apparatus body portion 5, it will be possible to realize the memory functions similar to the prior art. Therefore, it will be possible to make the circuit substrate 1 separable from the apparatus body portion 5.

Figure 4:
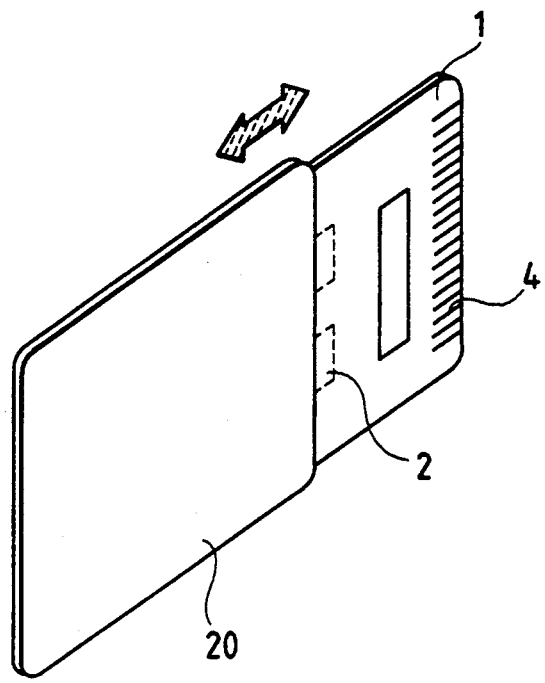
FIG. 4 is the schematic diagram of the protective cover used for the circuit substrate in one of the preferred embodiments of time present invention.

As shown in FIG. 4, if the protective cover 20 that encloses the circuit substrate 1 is constructed out of at least a magnetic material, it will be possible to prevent the penetration of stray magnetic fields inside the protective cover 20. Because of this, it will be possible to prevent the effect of stray magnetic fields on the Bloch line memory element. Because the effect of stray magnetic fields can be prevented on the card type substrate in the detachable state, it will be possible to realize the functions equivalent to IC cards in a solid state magnetic memory.

By making the protective cover 20 and the circuit substrate 1 separable from each other, if required, it will be possible apply the drive magnetic field efficiently to the Bloch line memory element during the memory operation.

Figure 5:
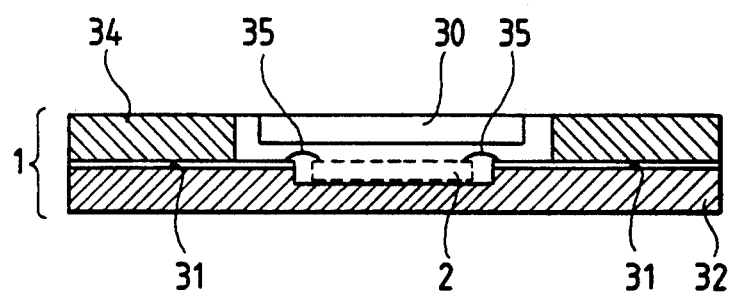
FIG. 5 is the cross-sectional view of time circuit substrate in one of time preferred embodiments of the present invention.

As shown in FIG. 5, if a linear raised ferrite plate 30 is provided in a position at least overlapping the Bloch line memory element 2 mounted on the circuit substrate 1, the distribution of the magnetic field passing through this linear raised ferrite plate can be made to be uniform. It is necessary make this magnetic field uniform in order to ensure that the averaging of the magnetic field strength is achieved so as to propagate the Bloch line pairs (the information unit). Since it is possible to make the drive magnetic field applied uniformly to the memory element, it is possible to realize memory operation similar to the prior art in the condition in which the card type substrate is made detachable.

Figure 12:
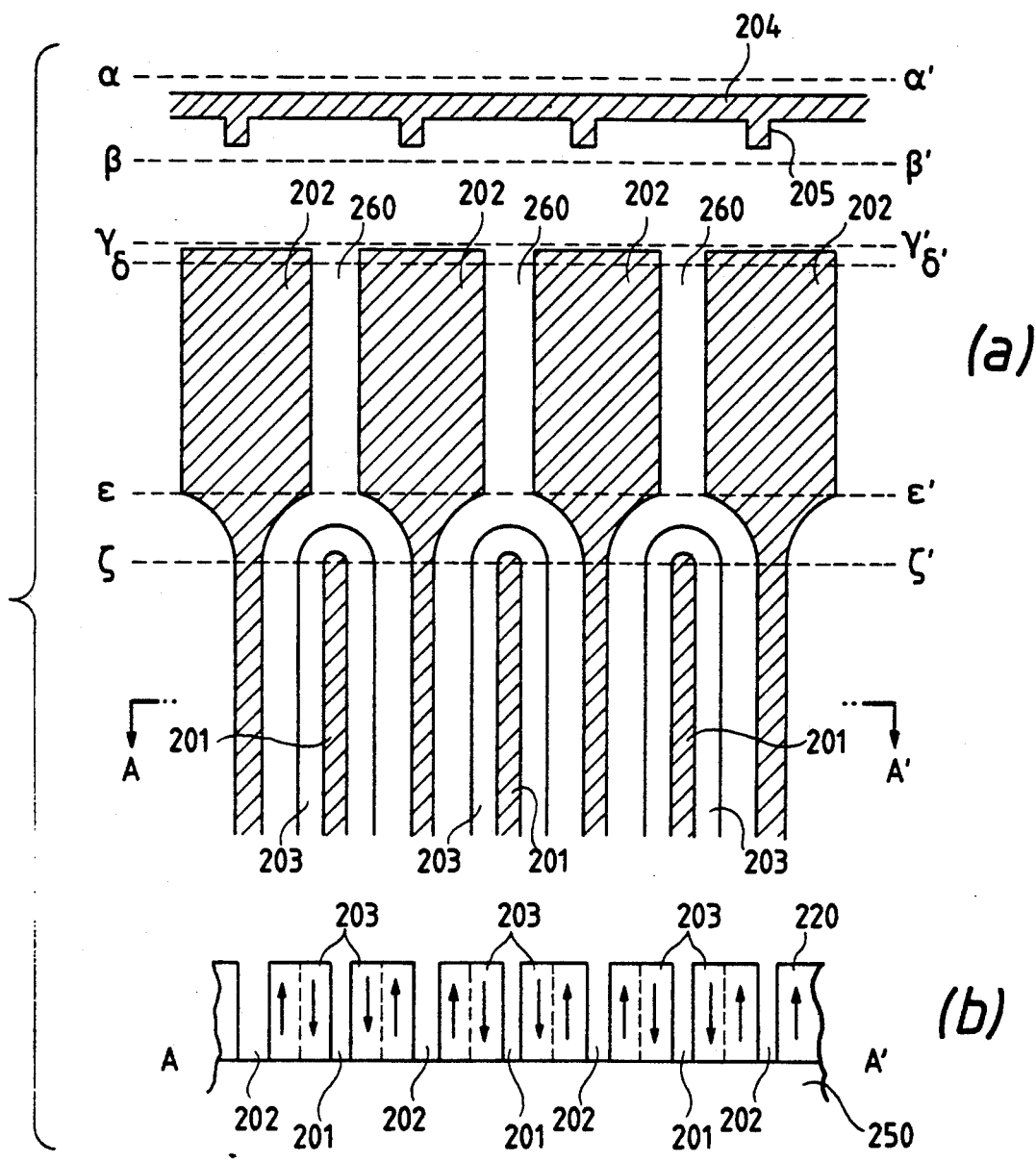
FIG. 12 is a schematic diagram showing a memory element that can be mounted on a card type memory substrate in a preferred embodiment (duplicate) of the present inventions.
Figure 13A:
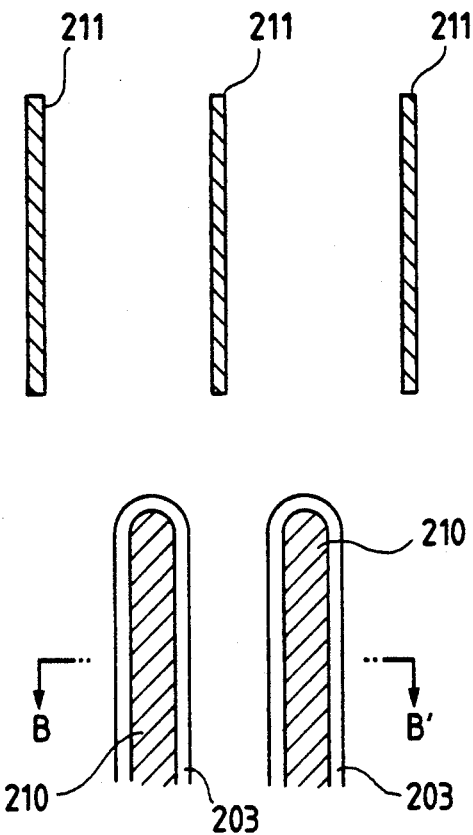
FIGS. 13a, 13b, and 13c are the schematic diagrams of the conventional Bloch line memory element.
Figure 13B:
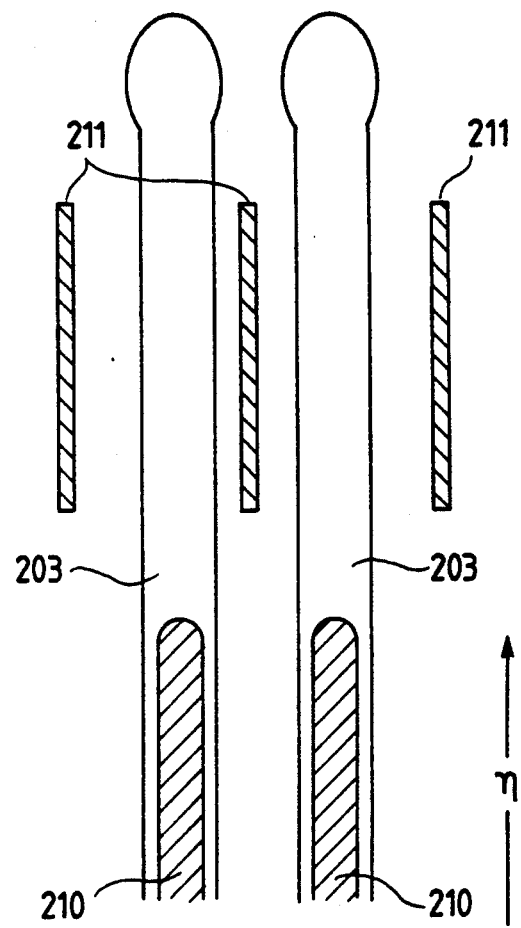
Figure 13C:
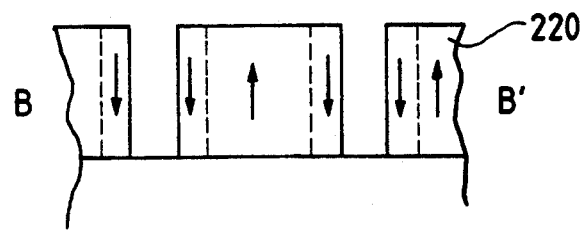

Regarding the construction of the memory element, as shown in part (a) of FIG. 12, the pattern 201 provided either inside or on the magnetic garnet film is used as a positioning means for the stripe magnetic domain 203 that forms the memory loop, and the first pattern 201 is provided either inside or at least overlapping the stripe magnetic domain, thereby realizing the fixing of the magnetic domain similar to the prior art. In addition, by providing a second pattern 202 is provided between neighboring stripe magnetic domains, a repulsive force is generated in the direction to make the stripe magnetic domains shrink. This repulsive force has an effect equivalent to the application of bias magnetic field in the prior art. As a consequence, the required fixing of the magnetic domains is realized without the use of a permanent magnet. Part (b) of FIG. 12 is the cross-sectional diagram of the part A—A' in part (a) of FIG. 12.

By making the width of the second pattern 202 larger at the ends of the stripe magnetic domains, the repulsive force acting on the ends of the stripe magnetic domains is increased. As a consequence, it is possible to suppress the stretching of the magnetic domain ends. This has an effect equivalent to the bias magnetic field of the prior art and hence the required fixing of the magnetic domains is realized without the use of a permanent magnet.

By providing the function of suppressing the stretching of the stripe magnetic domains when the bias magnetic field range is −100 to 100 Oe, the required fixing of the magnetic domains is realized without the use of a permanent magnet which generates an equivalent strain field.

If the width of the second pattern 202 at the ends of the stripe magnetic domains is made larger to the required extent, the repulsive force on the stripe magnetic domains increases thereby making it possible to prevent the stretching of the ends of the stripe magnetic domains.

Also, by providing a perpendicularly magnetized film on the entire surface of the memory element and by setting the strength of the strain field from the perpendicularly magnetized film to be in the range 100 to −100 Oe, it is possible to prevent the stretching of the ends of the stripe magnetic domains under a bias magnetic field strength range of −100 to 100 Oe without the use of a permanent magnet which generates an equivalent strain field.

Since by using the above techniques it is possible to prevent the stretching of the ends of the stripe magnetic domains under a bias magnetic field strength range of −100 to 100 Oe without the use of a permanent magnet, it is possible to store information (independently in the Bloch line memory element) under normal environmental conditions in the state in which the card type substrate is detachable from the body portion of the memory apparatus.

By making the first and second patterns as the groove patterns formed by etching the magnetic film such as magnetic garnet film, etc., the required repulsive force on the stripe magnetic domains is obtained by the strain field generated by the opposite magnetization equivalent to groove patterns. Because of this, it is possible to realize the fixing of the magnetic domains without using a permanent magnet.

Further, by making the first and second patterns as the patterns formed by placing a magnetic film such as magnetic garnet film, etc., the required repulsive force on the stripe magnetic domains is obtained by the strain field generated by the magnetic film. Because of this, it is possible to realize the fixing of the magnetic domains without using a permanent magnet.

Further, by making the first and second patterns as the patterns formed by embedding a non-magnetic film within a magnetic garnet film, etc., the required repulsive force on the stripe magnetic domains is obtained by the strain field generated due to the equivalent opposite magnetization in the non-magnetic film. Because of this, it is possible to realize the fixing of the magnetic domains without using a permanent magnet.

Further, by providing a perpendicularly magnetized film on the entire surface of the Bloch line memory element a perpendicular magnetic field is applied to the memory element. By controlling the magnetization direction of the film so that the magnetic domains shrink due to the perpendicular magnetic field, it will be possible to realize the fixing of the magnetic domains equivalent to the conventional method of using a permanent magnet. Since the fixing of the magnetic domains can be realized by providing a thin film on the chip, it will be possible to realize the thickness reduction of the substrate circuit required in the present invention.

Further, by providing a longitudinal magnetic film on the entire surface of the Bloch line memory element, a longitudinal magnetic field from that film acts on the memory element. Since it is possible to maintain the Bloch line pairs that are the information units in a stable manner by the longitudinal magnetic field in a manner similar to the prior art, it will be possible to eliminate the permanent magnet on the circuit substrate that was required in the prior art. Because of this, it will be possible to realize the thickness reduction of the circuit substrate.

Further, an electromagnetic induction circuit is provided in the apparatus body portion in addition to the magnetic field generating circuit for driving the Bloch line memory element and the signal processing circuits so that power is supplied via the electromagnetic induction circuit to the circuit substrate side in which the Bloch line memory element is mounted. The electromagnetic induction circuit has the function of a type of transformer and is coupled electromagnetically to the electromagnetic induction circuit provided on the circuit substrate side. As a result, it will be possible to supply electric power to the circuit substrate without actual physical contact.

Further, photo-semiconductor devices consisting of at least light receiving and light emitting devices are provided in the apparatus body portion containing the magnetic field generation circuit for driving the Bloch line memory element and the signal processing circuit, and devices with the same functions are provided in the circuit substrate whereby it is possible to transfer signals between them through these devices. Photo-semiconductor devices have already been realized in the field of optical communication and are easy to be adapted to the present invention. Since it will be possible to exchange signals in a contactless manner between the circuit substrate and the apparatus body portion, it is possible to realize functions similar to IC cards.

Further, by providing the function of receiving wired or wireless broadcasts or communication information in the Bloch line memory apparatus body portion containing the magnetic field generation circuit for driving the Bloch line memory element, signal processing circuit, and the means for transferring signals or for supplying electric power to the circuit substrate on which the Bloch line memory element is mounted, and by providing the Bloch line memory apparatus body portion with the function for selecting the required signal and storing the information in the circuit substrate, it is possible to realize the functions suitable for the recent trend of information distribution systems without having to connect the apparatus with other information processing equipment.

Further, by providing the function of receiving wired or wireless broadcasts or communication information in the Bloch line memory apparatus body portion containing the magnetic field generation circuit for driving the Bloch line memory element, signal processing circuit, and the means for transferring signals or for supplying electric power to the circuit substrate on which the Bloch line memory element is mounted, and by providing the Bloch line memory apparatus body portion with the function for selecting the required signal, converting the signal to a digital signal and storing the information in the circuit substrate, it is possible to realize the functions suitable for the recent trend of information distribution systems without having to connect the apparatus with other information processing equipment.

Further, by making is possible to select the required information that is stored in the circuit substrate and reproducing that information as a digital signal or an analog signal, it will be possible to reproduce the received signal without having to connect other information processing equipment, so that a unitary apparatus can have both functions of recording the information of high universality and processing it.

Further, by providing a speaker, earphone, or headphones in the apparatus body portion and providing the function of converting the reproduced signal into sound, it will be possible to hear the sound without having to connect other information processing equipment.

Further, by providing the apparatus body portion with the display function and the function of displaying images or character information from the reproduced signal, it will be possible to display the information in a visible form without having to connect other information processing equipment.

Further, the recorded information can be reproduced in the form of sound by providing an information processing equipment with sound reproduction circuit and digital signal processing circuits and coupling that information processing equipment with the card type substrate. Since the conventional type of memory media such as tapes or disks are not used, it is possible to realize a sales and distribution system using only information. Since plastic or other materials are not used for sales and distribution, this is also suitable for environmental protection.

Further, the recorded information can be reproduced in the form of images or visible character information by providing an information processing equipment with the display function and digital signal processing circuits and coupling that information processing equipment with the card type substrate. Since the conventional type of memory media such as tapes or disks are not used, it is possible to realize a sales and distribution system using only information. Since plastic or other materials are not used for sales and distribution, this is also suitable for environmental protection.

DESCRIPTION OF THE PREFERRED EMBODIMENTS

Embodiment 1

A preferred embodiment of the present invention is described below from FIG. 1. Four Bloch line memory elements 2 constituting the memory portion are mounted on the circuit substrate 1. Semiconductor circuits 3 are also mounted on the circuit substrate 1. Electrical contacts 4 are provided at the edge of the circuit substrate 1. The apparatus body portion 5 is made up of the drive system 6 (coil, permanent magnet, and magnetic circuit) for driving the Bloch line memory element, the driver 9 that supplies electrical power to the driving system, the controller 7 that controls the Bloch line memory element, and the connector 10 that makes possible the electrical connection to the circuit substrate. The active elements 7 and 9, the connector 10, and the drive system 6 are all electrically connected as described later. The apparatus body portion is connected to computers or information equipment by signal cable 11 over which the address information, the memory information, and the different control signals are input or output.

An opening portion 12 is formed in the apparatus body portion which is the drive means so that the circuit substrate 1 can be inserted in the opening portion. By inserting the circuit substrate 1 the electrical contacts 4 provided in the circuit substrate and the connector 10 in the apparatus body portion are coupled and the signals necessary for memory operation (the address, data, read/write information, etc.,) are transferred from the apparatus body portion to the circuit substrate 1. As a result, the memory operation similar to the prior art is realized.

As is evident from the figure, there is no drive system 6 in the circuit substrate for driving the Bloch line memory element. (In the prior art, this drive system corresponds to the coil, permanent magnet, and magnetic circuit formed inside the module.) Therefore, the circuit substrate 1 can be made as thin as the memory element 2. Further, by providing these expensive components in the apparatus body portion 5, it is possible to reduce the manufacturing cost of the circuit substrate 1.

Further, by making the circuit substrate 1 installable in and removable from the apparatus body part 5, it is possible to use selectively a number of circuit substrates containing the Bloch line memory elements in the same apparatus main unit. As a result, the memory capacity of the Bloch line memory device can be increased without any limit as compared to the prior art in which the memory capacity was limited to on circuit substrate with a limited information capacity. This is a function not present in the Bloch line memory device of the prior art and is a new function which can be realized by the present invention.

FIG. 2 shows the plan view of the circuit substrate 1. The capacity of the Bloch line memory element 2 is 256 Mb per element. Four memory elements are mounted on each circuit substrate. The semiconductor circuit 3 is provided within this circuit substrate. The electrical contacts 4 are provided at the edge of the circuit substrate for realizing the connection with the apparatus body portion. In order to provide the functions of the 256 Mb elements installed in this circuit substrate, about 20 terminal pins are required (Number of pads: in the case of the configuration of 16 blocks per element). When four elements are mounted in one circuit substrate, a total of 80 pins will be required. Providing all these at one edge of the circuit substrate is nearly impossible for achieving the reliability of the electrical contacts. (When a large number of contacts are provided in a limited space, the area per contact will become small and the connection becomes difficult.) In order to solve this problem in the present invention, measures are taken to reduce the number of pins required. This is described below using FIG. 3.

Figure 3:
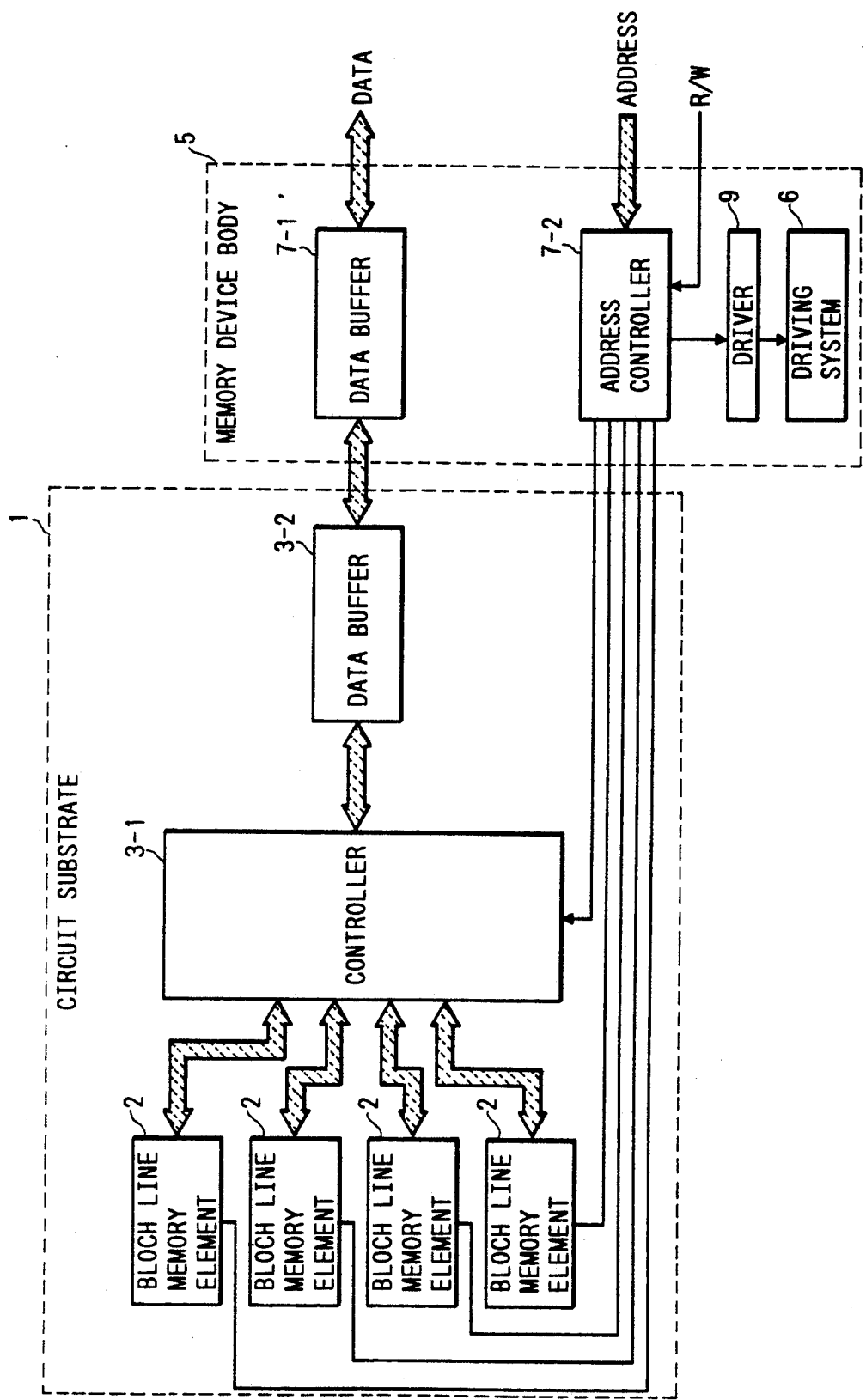
FIG. 3 is the block diagram for explaining one of the preferred embodiments of the present invention.

FIG. 3 shows the block diagram of the Bloch line memory device of the present invention. The data, address information, and the read/write (R/W) information are input from the information processing equipment to the Bloch line memory apparatus body portion 5. The data is stored in the data buffer 7-1 within the controller 7. The address information is stored in the address control section 7-2 within the controller 7. The selection of the Bloch line memory element is made in the address control section 7-2 and the necessary memory element 2 is activated. At this time, the timing of activating the Bloch line memory element is calculated in the address control section 7-2, and the signal for moving the recorded information in the memory is sent to the driver 9. In response to this signal, the driver 9 supplies electrical power to the drive system 6. The drive system 6 is made up of coils, magnetic circuit, and permanent magnet and converts the electrical power into magnetic field and drives the Bloch line memory element (and moves the information).

The data stored in the data buffer 7-1 is first transferred to the data buffer 3-2 in the semiconductor circuit mounted on the circuit substrate 1 and then transferred to control section 3-1. The memory element which is to be used for writing in or reading out the data is selected in the control section based on the information from the address control section 7-2.

In the present invention, the size of the circuit substrate can be made equal to that of an IC card, that is, length 86 mm and width 54 mm. If the size of the circuit substrate is increased, although the storage capacity per circuit substrate increases, it will be more difficult to store and transport the circuit substrates. The present invention is specifically intended for application as an external storage device in small sized and light weight information processing equipment, and by making the size equal to that of a card functions not present in the conventional Bloch line memory devices will be generated. This substrate can be called a Bloch line memory card.

In order to acquire the above functionality, it is necessary to protect the memory elements 2 inside the circuit substrate 1 from stray magnetic fields. In other words, in order to realize the functionality of the memory device, it is necessary to make the circuit substrate 1 portable. In the conventional memory device, since the memory elements are stored inside the apparatus body portion, it will be protected sufficiently from stray magnetic fields during the transportation of the apparatus. However, in the present invention, it is necessary to protect the circuit substrate itself. In order to do this, the circuit substrate (the memory card) is enclosed inside a case shaped protective cover 20 shown in FIG. 4. This protective cover 20 is made movable and the structure is made such that it is removed when the circuit substrate is slided into the apparatus body portion. On the contrary, the structure is made so that the cover gets closed (either automatically or manually) when the circuit substrate is removed from the apparatus body portion. It is easy to realize this by adapting the structure of the optical magnetic disk that is in the prior art. In the Bloch line memory device of the prior art, there is no provision for inserting the protective cover 20 between the memory element and the drive system and has become necessary for the first time due to the present invention. The material used for the protective cover 20 is a magnetic metal such as Fe-Ni (permalloy), a plastic like polymer resin in which magnetic materials are mixed, resin such as simple plastic, or Al or other metal.

Further, as shown in FIG. 5 (this figure is the cross sectional view of the circuit substrate 1) a linear raised ferrite plate is provided so that it at least overlaps the Bloch line memory elements mounted in the circuit substrate 1. The circuit substrate 1 is constructed from glass epoxy, or Gadolinium Gallium Garnet ($Gd_3Ga_5O_{12}$), plastic, etc. Between the lower layer substrate 32 and the upper layer substrate 34 is formed the electrical interconnections (circuit) 31 which is connected to the pads of the Bloch line memory element 2 and the wires 35. The linear raised ferrite plate 30 consisting of a ferrite plate of 0.5 mm thickness is provided so that it at least overlaps the Bloch line memory elements 2. This linear raised ferrite plate is provided to make the drive magnetic field applied from the apparatus body portion uniform. In the prior art, the linear raised ferrite plate was being provided inside the module. However, in the present invention it is provided on the circuit substrate side with the additional purpose of protecting (mechanically protecting) the chip. Also, although the linear raised ferrite plate is shown in the figure only on one side, there is absolutely no problem in implementing the present invention if it is provided on both sides. Further, when sufficient mechanical strength of the circuit substrate 1 is acquired, there is no problem in implementing the present invention even if the linear raised ferrite is provided on the apparatus body portion. Tn addition, there is no problem in implementing the present invention even if the ferrite forming the linear raised ferrite plate is coated directly on the memory chips by sputtering, etc. Although a 0.96 micron thick magnetic garnet film of $(YSmLuGd)_3(FeGa)_5O_{12}$ is used as the magnetic film forming the memory element, it is possible to use other magnetic garnet films also.

In the present invention, four Bloch line memory elements are arranged in plane surface. Therefore, the thickness of the circuit substrate 1 will be about 1 mm. If the electrical interconnections 31 mentioned above can be formed appropriately, it is also possible to arrange the memory elements 2 in the multi-layer form. In this case, the thickness of the circuit substrate 1 increases depending on the number of layers. According to our study, the limit of the thickness is about 1 cm for use as the external memory device in small sized and light weight information processing equipment. If this thickness is exceeded, there will be problems in portability.

Embodiment 2

Figure 6:
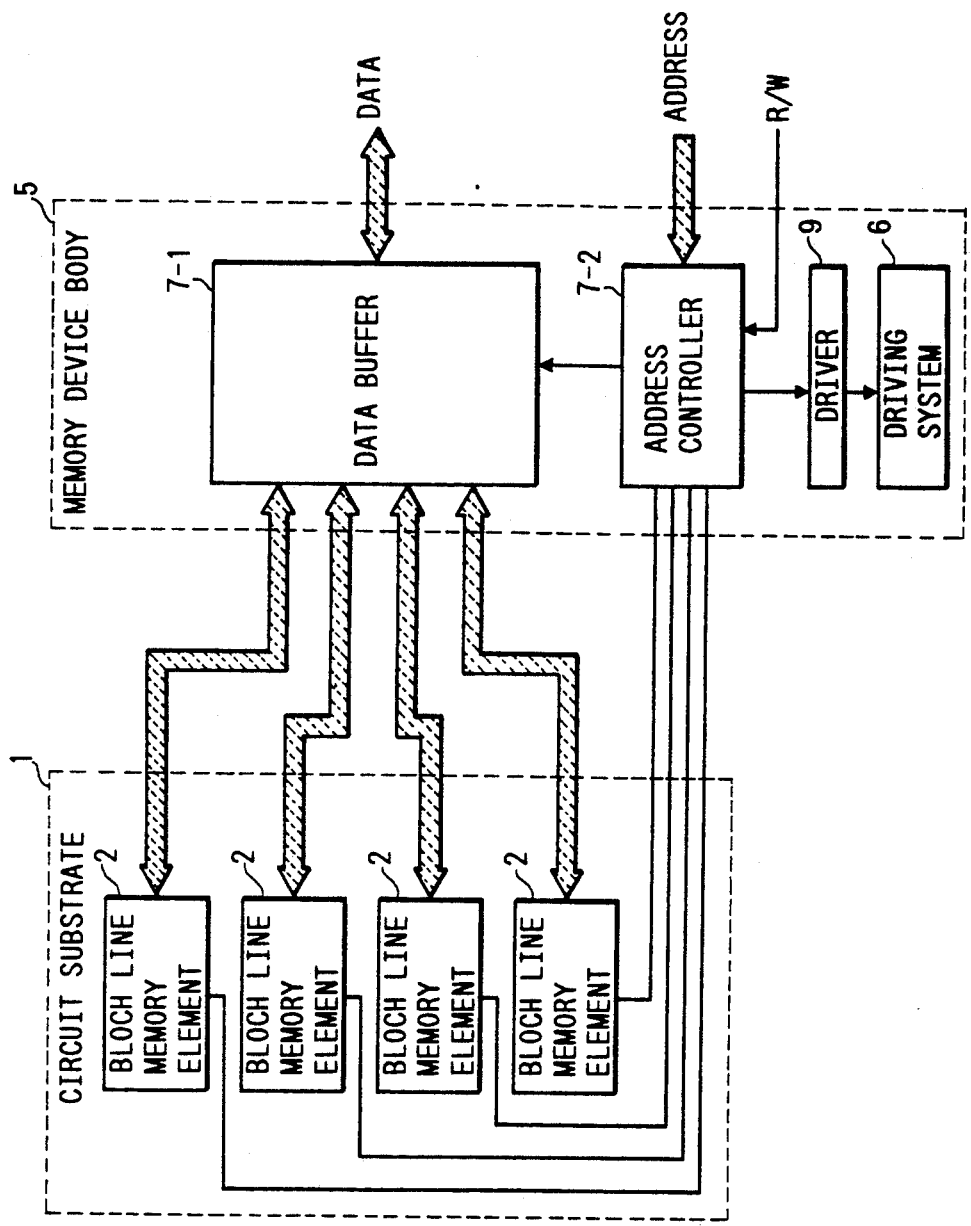
FIG. 6 is the block diagram for explaining another preferred embodiment of the present invention.

The first preferred embodiment was described above. Next, the second preferred embodiment will be described using FIG. 6. Similar to FIG. 3, FIG. 6 also shows the block diagram of the Bloch line memory device. In the example of FIG. 6, there is no semiconductor circuit in the circuit substrate 1. Therefore, the selection of the Bloch line memory element is all done by the controller 7 provided inside the apparatus body portion. The controller 7 is formed at least with the data buffer 7-1 and the address control section 7-2. This configuration has the function of selecting the Bloch line memory element that has to be initiated based on the information input to the address control section 7-2, and transferring the data stored in the data buffer 7-1 to the selected Bloch line memory element 2 (or the function of reading the information from the selected Bloch line memory element and storing that information in the data buffer 7-1). Since there is no semiconductor circuit inside the circuit substrate 1, it will be possible to reduce the production costs. In order to realize this construction, it is necessary to reduce the number of pads of the Bloch line memory element due to the reasons described earlier. In the present preferred embodiment of the present invention, the number of pads is reduced to 12 by making the number of blocks in the 256 Mb element to two. Apart from this, it is also possible to reduce the number of electrical contacts by changing the design of the conductor circuit inside the circuit substrate 1. In either case, by reducing the number of pads per element the number of the electrical contacts 4 in the circuit substrate 1 gets reduced, and it will become simply unnecessary to form semiconductor circuit inside the circuit substrate 1. Since there is no semiconductor inside the circuit substrate 1 there will be no problem of damage due to radiation such as $\alpha$-rays which is specific to semiconductor circuits. As a result, it is possible to realize a circuit substrate of high reliability.

Embodiment 3

Next, as the third preferred embodiment is disclosed a circuit substrate without the protective cover 20. In a Bloch line memory element, the Bloch line pairs that are microscopic magnetization structures move within the element. (The details of this are described in Japanese Patent Laid-Open No. 59-101092, etc.) As a result, since there is the danger that the Bloch line pairs move due to the effect of even stray magnetic fields, the protective cover 20 was provided in the preferred embodiment 1. In the third preferred embodiment, instead of providing a protective cover, mis-operation is prevented by providing a means that gives strength against stray magnetic fields to the Bloch line pairs themselves. In specific terms, the migration of the Bloch line pairs is suppressed (and the magnetic retentivity is increased) by carrying out thermal diffusion of elements such as Al or Si on the surface layer of the element to a depth in the range of 200 to 1000 Angstroms at least in the area of the memory element in which the stripe magnetic domains are present (over the entire surface of the memory element in the present preferred embodiment). Apart from this, a similar effect can be realized by minute undulations at a pitch of about 0.05 microns are formed on the surface of the film to a depth of within 10 nm. Although the shape of the undulations is not important, normally, this shape is like a sine wave. The migration of Bloch line pairs is controlled and the effect of the stray magnetic fields that are weaker compared to the drive magnetic field is eliminated by carrying out the above measures either independently of in combination with each other. As a result, it is possible to obtain a circuit substrate 1 which does not require a protective cover.

Embodiment 4

Next, the improvements and measures taken on the memory element for realizing the present invention will be described below. The part (a) of FIG. 12 shows the outline of the patterns related to fixing the stripe magnetic domains that form the memory portion of the Bloch line memory element. The part (b) of the same figure is the cross-sectional view of the cross-section A—A' of part (a). The magnetic garnet film 220 is a (YSmLuGd)$_3$(FeGa)$_5$O$_{12}$ film of 0.96 microns thickness formed on the substrate 250 made of Gd$_3$Ga$_5$O$_{12}$ garnet by liquid phase epitaxy. The first groove pattern 201 of width of 0.6 to 0.8 microns and the second groove pattern 202 are formed in the magnetic garnet film 220. These groove patterns are formed by completely removing the magnetic garnet film. The stripe magnetic domain 203 of width of 0.8 to 1.0 micron is made to be located around the periphery of the first groove pattern 201 and the stripe magnetic domain is fixed.

The second groove pattern 202 is provided between the neighboring stripe magnetic domains 203. The width of the second groove pattern is varied as shown in part (a) of the figure. In specific terms, the width of the second groove pattern 202 is made large between $\gamma$—$\gamma'$ and $\epsilon$—$\epsilon'$, and a continuous variation is provided between $\epsilon$—$\epsilon'$ and $\zeta$—$\zeta'$ is made thin on the order of 0.3 to 0.8 microns below $\zeta$—$\zeta'$. The width is made larger between $\gamma$—$\gamma'$ and $\epsilon$—$\epsilon'$ relative to below $\zeta$—$\zeta'$ by an amount equal to the width of the stripe magnetic domain 203. The periodicity (pitch) of the first groove pattern and the periodicity (pitch) of the second groove pattern are both made equal to be about four times the width of the stripe magnetic domain 203. Further, the pitch between the first groove pattern 201 and the second groove pattern 202 is made equal to about twice the width of the stripe magnetic domain 203. The width of the grooveless portion 260 present between $\gamma$—$\gamma'$ and $\epsilon$—$\epsilon'$ is made almost equal to the width of the stripe magnetic domain 203.

In the present preferred embodiment, the construction is such that a grooveless portion is provided from $\beta$—$\beta'$ to $\gamma$—$\gamma'$ thereby forming a major line and the information is entered in to or read out from the memory portion at this area. The width of this area is set in the range of from about four times to about eight times the width of the stripe magnetic domain 203. Further, the groove pattern 204 for guarding is provided from $\beta$—$\beta'$ to $\alpha$—$\alpha'$ with a projecting portion equal to the pitch of the stripe magnetic domains.

In the case of the present preferred embodiment in which the width of the stripe magnetic domain 203 is 1.0 micron, the width of the groove pattern 204 for guarding is also about 1 micron, the width of the projecting portion 205 of the groove pattern 204 for guarding is about 1 micron, the length of the projecting portion 205 is about 1 to 2 microns, the spacing between $\alpha$—$\alpha'$ and $\beta$—$\beta'$ is about 2 to 3 microns (that is, the sum of the width of the groove pattern 204 and the length of the projecting portion 205), the spacing between γ—γ' and ε—ε' is made so that the conductor for input and output is placed and is about 70 microns, for example, in the present preferred embodiment (the input and output mentioned here is the operation of converting the presence of Bloch lines into the presence of bubbles or the opposite), and the spacing between ε—ε' and ζ—ζ' is about 2 microns (equal to the spacing between the first groove pattern 201 and the second groove pattern 202 in the neighborhood of the stripe magnetic domain 203).

Further, the area between β—β' and γ—γ' is the area necessary for bubble propagation, the area between δ—δ' and ε—ε' is the area in which the conductor for input and output is placed, and the area between γ—γ' and δ—δ' is an area that is none of the above.

The concrete dimensions of the above are the values calculated by computer simulation when the width of the stripe magnetic domain 203 is 1 micron and hence these dimensions will have to be optimized again if the conditions of the stripe magnetic domain 203 are changed. In the present preferred embodiment of the present invention, experimental confirmation has been done that satisfactory results are obtained using the above dimensions.

In order to obtain the effect of the present invention, in general, the presence of the second groove pattern is mandatory, and its shape also will have to be almost the same as that indicated in the present preferred embodiment.

The very important parameters for positioning the stripe magnetic domain 203 around the first groove pattern 201 are the width and pitch of the first groove pattern 201, and the width of the second groove pattern. It is possible to determine the suitability or otherwise of the positioning of the stripe magnetic domain 203 by calculating the average value of the effective magnetic field generated by these groove patterns and also considering the magnetostatic energy of the stripe magnetic domain 203. Of course, it is also acceptable if the appropriate width and pitch of the groove patterns is determined by experiment.

In the groove patterns provided in the magnetic garnet film 220, a magnetization is generated that is opposite in direction to the magnetization direction on the outside of the groove patterns in an equivalent manner. Due to this magnetization will be generated an effective magnetic field that has a direction to maintain in a stable manner the stripe magnetic domain present on the outside of the first groove pattern 201 and the stripe magnetic domain will be fixed by this magnetic field. No stripe magnetic domain exists on the outside of the second groove pattern 202. Therefore, a magnetization will be generated in the second groove pattern 202 that is opposite in direction to the magnetization in the first groove pattern 201. Since the direction of this magnetization and the direction of magnetization of the stripe magnetic domain are the same, a repulsive force will be generated from the second groove pattern 202 on the stripe magnetic domain 203. This repulsive force is equivalent to the bias magnetic field in the prior art, and it is possible to maintain the stripe magnetic domain 203 in a stable manner by balancing this with the fixing force from the first groove pattern. Due to a similar effect, the enlarged width portion of the second groove pattern (since it is thicker at the end of the stripe magnetic domain) can prevent the stretching of the stripe magnetic domain. Because of this, there will be no need for the permanent magnet used for generating the bias magnetic field.

In the above described preferred embodiment of the present invention, since a grooveless portion 260 is provided in the second groove pattern, it is possible to stretch the stripe magnetic domain by applying a bias magnetic field that can exceed the repulsive force on the stripe magnetic domain from the second groove pattern. As a result, it is possible to realize the element operation that is equivalent to the prior art without the use of a permanent magnet.

Further, the projecting portion provided in the groove pattern between β—δ' and α—α' is used for providing the offset function that determines the transfer direction in the transfer path forming the major line. This projecting portion is not required when using a transfer path that does not use offset. Also, the groove pattern 204 for guarding is provided for preventing the entry of unwanted magnetic domains from outside the memory area, and there is no problem in implementing the present invention even if a guard pattern of some other method is used.

Figure 14:
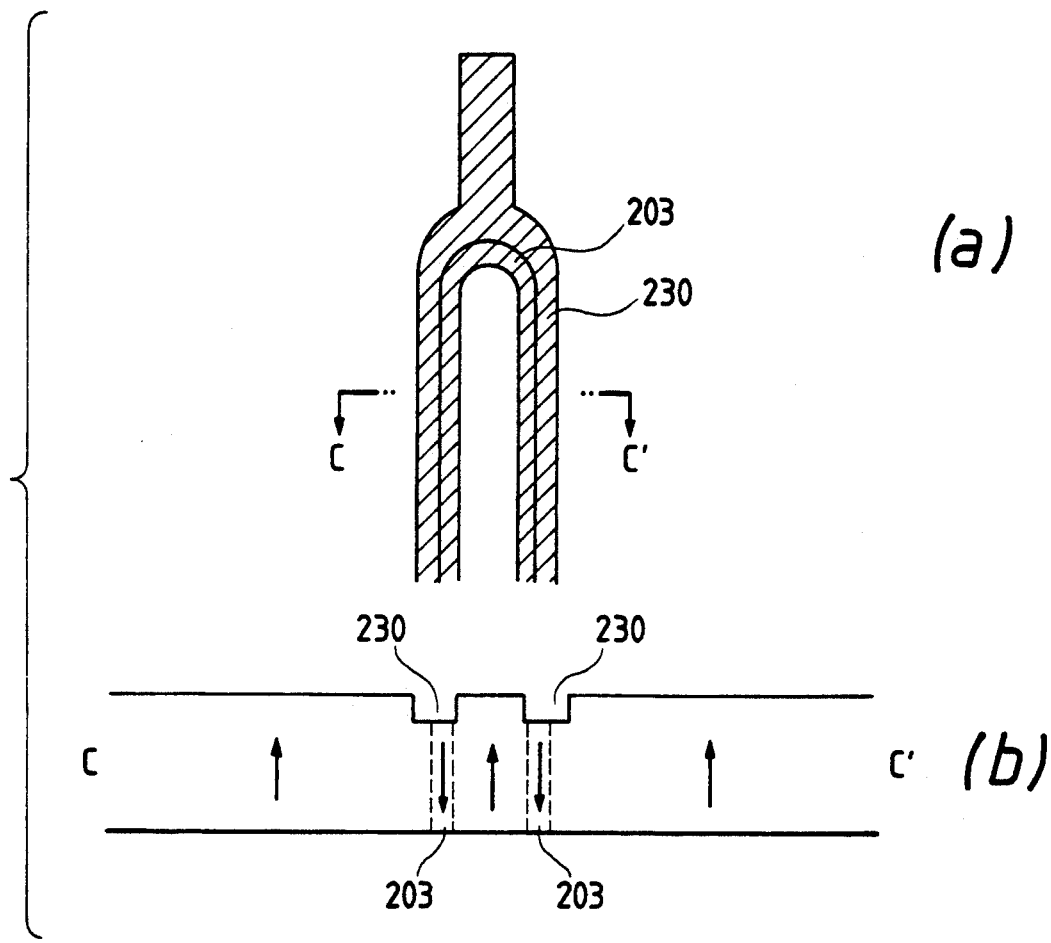
FIG. 14 is the schematic diagram for explaining another conventional Bloch line memory element.

Further, the shape of the groove pattern of the present invention is somewhat resembling the two dimensional shape of Japanese Patent Laid-Open No. 61-248296 shown in part (a) of FIG. 14. However, the arrangement condition of the stripe magnetic domain 203 shown in the cross-sectional view in part (b) of FIG. 14 is largely different. In other words, there is no second groove pattern in the method disclosed in Japanese Patent Laid-Open No. 61-248296 but a ring shaped groove pattern 230 is used to fix the stripe magnetic domain. Therefore, a bias magnetic field will be required for fixing the stripe magnetic domain.

Embodiment 5

Figure 15A:
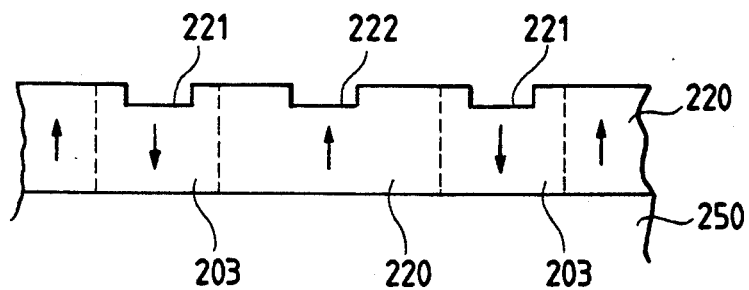
FIGS. 15a, 15b, 15c, and 15d are the schematic diagrams showing other memory elements that can be mounted on the card type memory substrate in preferred embodiments of the present invention.

Next, another embodiment of the present invention will be described below using FIG. 15a. This figure shows the example in which a shallow groove pattern 221 is used as the first groove pattern and the shallow groove pattern 222 is used as the second groove pattern. The depths of both the groove patterns is about 1000 to 1500 Angstroms. In this example also, it is possible to carry out the operation of the element due to an effect similar to that of the preferred embodiment 1 described earlier. The numeral 250 indicates the substrate.

Embodiment 6

Figure 15B:
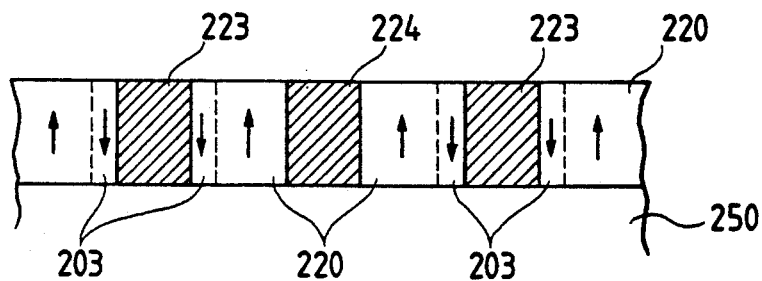

In a similar manner, as shown in FIG. 15b, even if the stripe magnetic domain 203 is fixed using the first pattern 223 that is non-magnetized (fixes the stripe magnetic domain 203) and the second pattern 224, it is possible to carry out the element operation without a permanent magnet due to an effect similar to the above preferred embodiment. Here, the non-magnetized pattern is formed by selectively implanting N, H, He, Ne, or other ions in large quantities (which depends on the type of ion used, and can be about $5 \times 10^{15}$ ions/cm$^2$ in the case of Nitrogen ions).

Embodiment 7

Figure 15C:
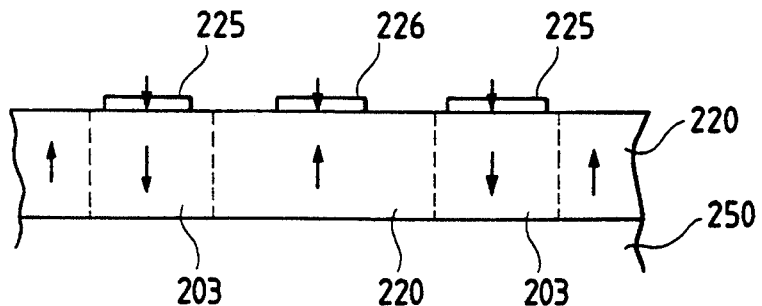
Figure 15D:
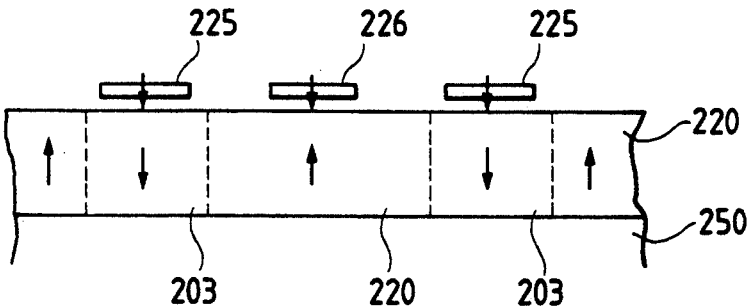

In a similar manner, as shown in FIG. 15c, even if the stripe magnetic domain 203 is fixed using the first magnetic pattern 225 (fixes the stripe magnetic domain 203) and the second magnetic pattern 226, it is possible to carry out the element operation without a permanent magnet due to an effect similar to the above preferred embodiment. It is possible to use, for example, a TbFeCo film of thickness of 2000 Angstroms for the first and second magnetic films. The same effect will be achieved even if the magnetic patterns are separated by about 500 to 2000 Angstroms from the surface of the magnetic garnet film 220 as shown in FIG. 15d. In this case, there is the effect that the stress generated during the formation of the magnetic film does not affect the magnetic garnet film. It is sufficient to insert a film of SiO, SiO$_2$, SiN, or polymer resin, etc., between the magnetic pattern and the magnetic garnet film in order to separate them.

Embodiment 8

The object of the present invention is to disclose the memory configurations that are suitable for realizing the reduction in thickness of Bloch line memory devices. Thus, we are disclosing the magnetic domain fixing methods that do not use a permanent magnet which causes problems in the realization of thickness reduction. In order to do this, apart from the above methods it is satisfactory if a perpendicularly magnetized film is provided on the entire memory element. By appropriately magnetizing the perpendicularly magnetized film and setting the strength of the strain magnetic field generated from it to be in the range −100 to 100 Oe (in the direction of the bias magnetic field), it is possible to realize the fixing of the stripe magnetic domains without a permanent magnet under normal environmental conditions. Because of this, it is possible to store the information independently in the Bloch line memory element alone similar to the preferred embodiments described above.

It is possible to use a TbFeCo film, a multiple layer film of Pt and Co, a TbFe film, etc., as the perpendicularly magnetized film. The appropriate thickness of the perpendicularly magnetized film varies depending on the remanence of the specific perpendicularly magnetized film, and is, for example, about 2000 Angstroms in the case of the TbFeCo film. In this case, it is preferable to make the distance between the magnetic garnet film and the perpendicularly magnetized film about 5000 Angstroms.

The second groove pattern will not be necessary when the stretching of the stripe magnetic domains is prevented by providing a perpendicularly magnetized film on the surface of the element.

Embodiment 9

Figure 7:
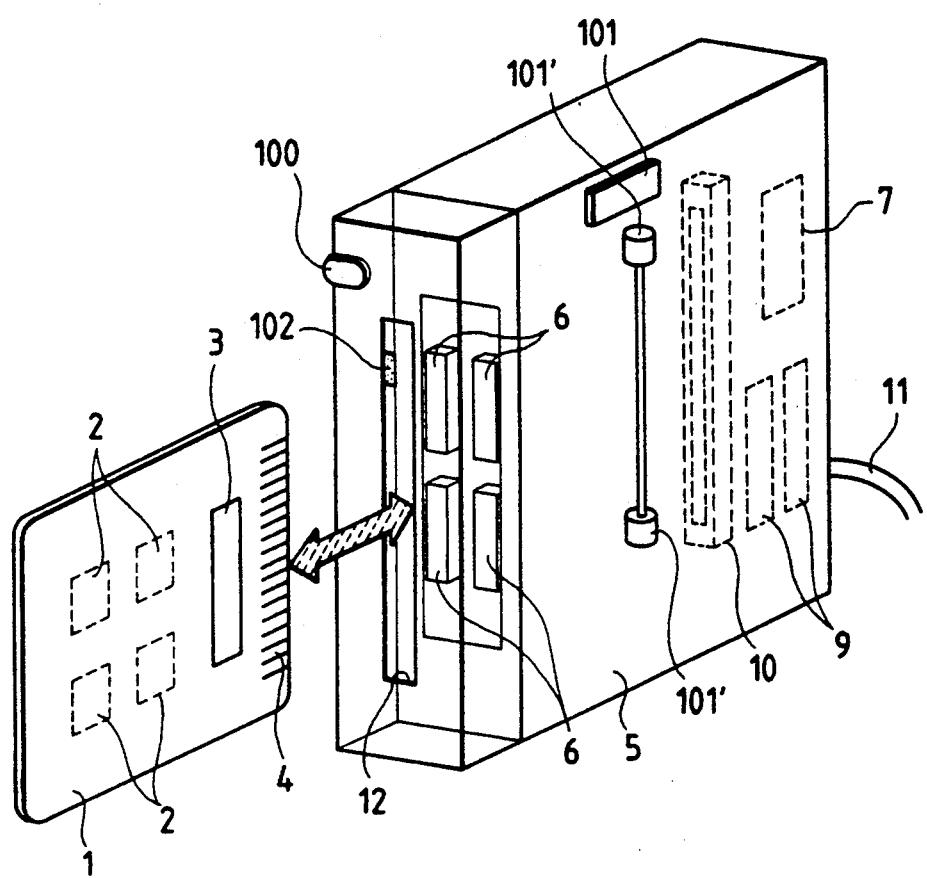
FIG. 7 is time schematic diagram of time Bloch line memory device for explaining another preferred embodiment of time present invention.

According the preferred embodiments described above, it is possible to realize a large capacity memory device that can be easily inserted into and removed from the information processing equipment, etc. An example in which the apparatus body portion is provided with the function that automatically carries out the feature of insertion and removal is described below using FIG. 7. This figure shows a Bloch line memory device similar to the one described in the preferred embodiment 1. In this example, the difference is that the card removal switch 100 is provided on the surface of the memory card insertion section. The card removal switch 100 is connected to the card loading feature control section provided in the apparatus body portion, and when the switch is pressed, the autoloader 101' will be started and the card will be ejected automatically. At this time, it is also possible to provide the feature for removing or replacing the protective cover described earlier. The switch 100 is connected to the power supply circuit of the apparatus body portion and the power supply of the unit is turned OFF automatically after the card is ejected. Using this function, it is possible to realize the reduction in the power consumption of the apparatus body portion. Further, it is possible to carry out the insertion of the card automatically by providing a microswitch 102 in the card insertion portion and by causing the autoloading feature 101 to be started simultaneously with the operation of this switch. It is possible to realize easily the autoloading features 101 and 101' by the application of the technology that has already been developed practically in the telephone instruments, etc., that use prepaid cards.

Figures 8A, 8B:
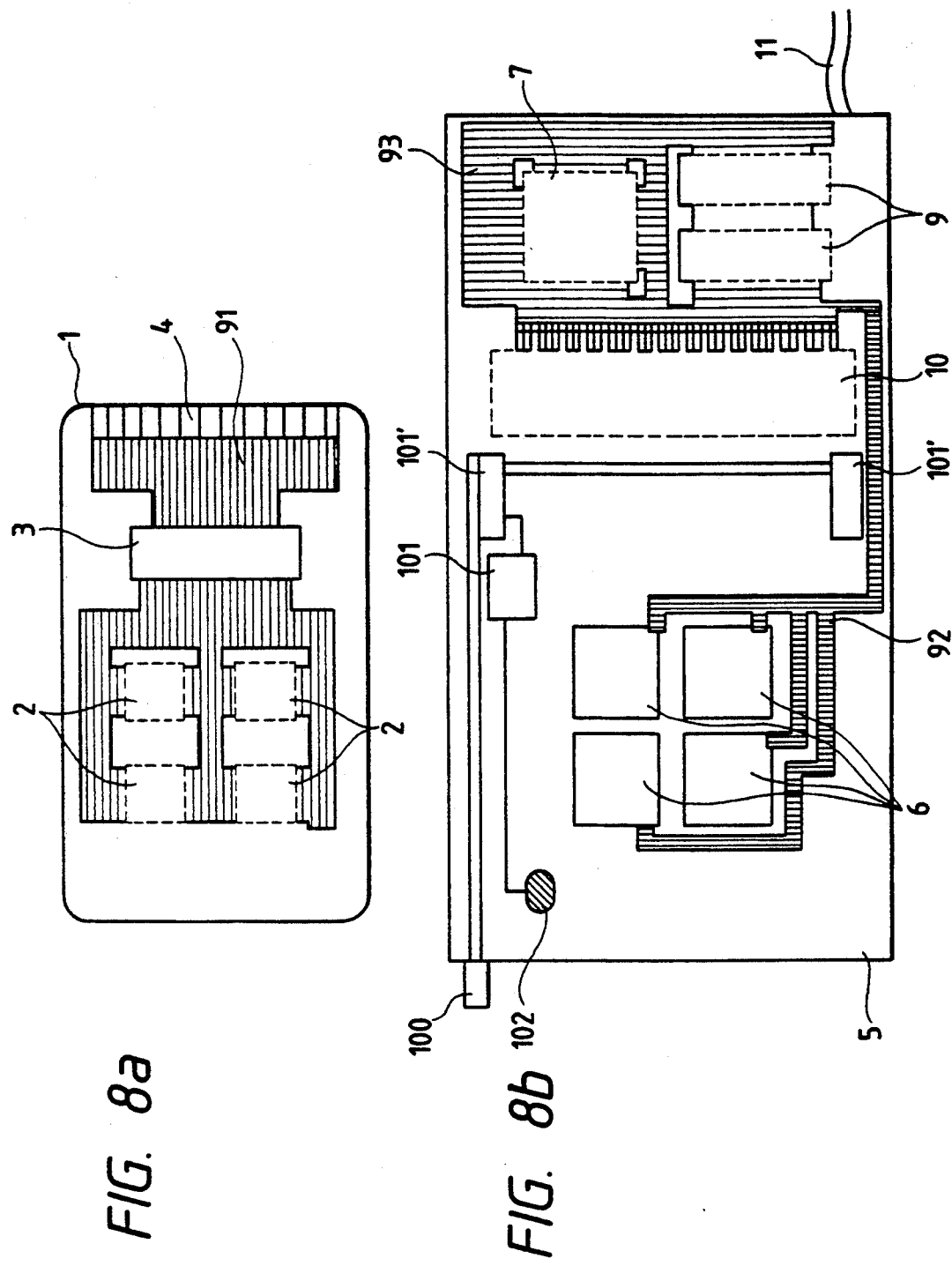
FIGS. 8a and 8b are the plan views of the card type circuit substrate and the body portion unit in another preferred embodiment of the present invention.

FIG. 8a and FIG. 8b show the cross-sectional view of the apparatus in the above preferred embodiment. Four Bloch line memory elements 2, the semiconductor circuit 3, and the electrical contacts 4 are provided in the card (circuit substrate) 1. The wiring interconnections 91 are provided from the electrical contacts 4 to the semiconductor circuit 3 and from the semiconductor circuit 3 to the Bloch line memory elements. The wiring interconnections are either flexible circuits or fine line wiring circuits provided on a glass epoxy substrate.

The apparatus body portion comprises the drive magnetic field generation circuit 6, the connector 10, the controller 7, the driver 9, the removal switch 100, the microswitch 102, and the card loading features 101 and 101'. The apparatus body portion is connected to the external information processing equipment via the signal lines 11 and the signals are input to the controller 7. The signals processed by the controller 7 are transferred either to the driver 9 or the connector 10. The necessary wiring interconnections 93 are provided for realizing this.

Further, the driver 9 supplies the electrical power required for the drive magnetic field generation circuit 6. This is also done by providing the wiring interconnections 92.

The removal switch 100 initiates the card loading features 101 and 101'. In order to realize this, the removal switch is connected to the loading features either mechanically or electrically.

Further, the microswitch 102 is operated at the time of card insertion and initiates the card loading feature 101 in a similar manner. In order to realize this, the removal switch is connected to the loading features either mechanically or electrically.

Embodiment 10

Figures 9A, 9B:
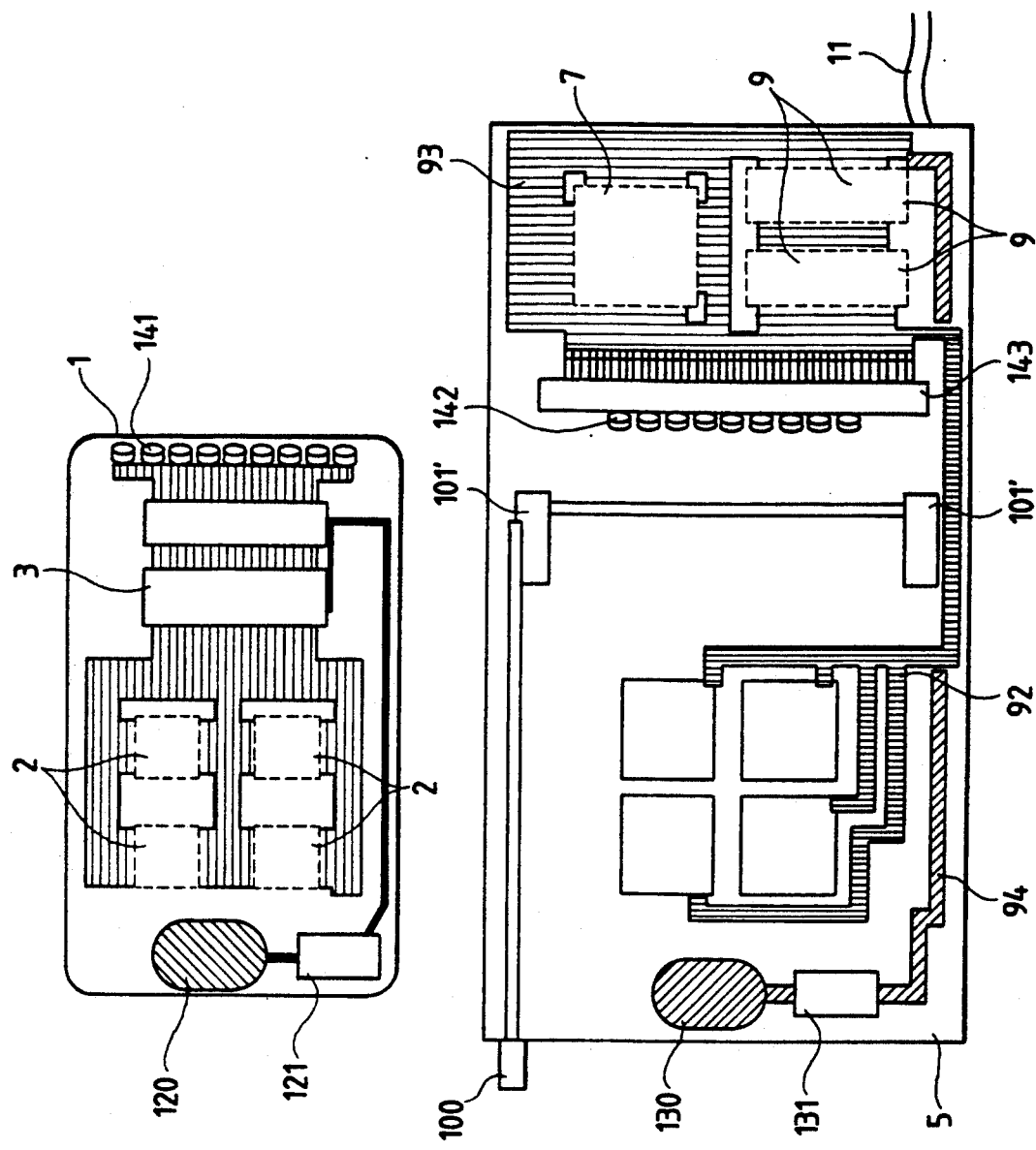
FIGS. 9a and 9b are the plan views of the card type circuit substrate and the body portion unit in another preferred embodiment of the present invention.

In the above preferred embodiments, the card 1 is connected to the apparatus body portion 5 using electrical contacts. However, when the operations of insertion and removal are carried out very frequently, there is the danger of the electrical contacts deteriorating. In order to prevent this it is sufficient to transfer the signals via photo-semiconductor elements. This method is described next. Similar to the above preferred embodiment, FIG. 9a and FIG. 9b show the cross-sectional view of the apparatus. Instead of the electrical contacts, a plurality of photo-semiconductor elements 142 are provided on the card substrate 1. Each of these photo-semiconductor elements comprises a light receiving portion and a light emitting portion. In the apparatus body portion also, photo-semiconductor elements 142 are provided instead of the electrical contacts (143 is the drive circuit for the photo-semiconductor elements). Similarly, these each of these photo-semiconductor elements also comprises a light receiving portion and a light emitting portion. The transfer of signals is realized without the use of electrical contacts by positioning the light receiving portions and the light emitting portions on the card 1 side and the apparatus body portion 5 side so that they are coupled with each other (by providing a positioning feature).

In order to operate the Bloch line memory elements, analog signals will be required in addition to the digital signals. Very often it is difficult to transfer analog signals via photo-semiconductor elements when the amplitude is large. Further, the supply of the electrical power for driving the photo-semiconductor elements on the card side too will become a problem. Although it is possible to think of providing these signal lines and power supply lines by means of electrical contacts, an electromagnetic induction circuit 120 is provided on the card side in order to realize a fully non-contacting type of card memory. The electrical energy obtained from the electromagnetic induction circuit 120 is converted to the required voltage by the circuit 121 and the electrical power required for the Bloch line memory element 2 and the semiconductor circuit 3 in the card 1. It is possible to drive the semiconductor circuit and the photo-semiconductor elements by supplying electrical power from the circuit 121. Further, it will be possible to transfer analog signals with large amplitudes using the same method since it will be possible to amplify the analog signals by the semiconductor circuit 3 in the card substrate.

In order to realize this, an electromagnetic induction circuit 130 is provided also in the apparatus body portion and electrical power is supplied to the card side when the card is inserted. Further, the frequency conversion, etc., of the supplied power is carried out in the control circuit 131 so that the electrical power can be converted into magnetic field efficiently in the electromagnetic induction circuit 30. The numeral 94 denotes the wiring interconnections for power transmission.

Further, it is also possible to transmit signals using the electromagnetic induction circuits 120 and 130 simultaneously with the transfer of electrical power. In other words, the electrical power is modulated on the low frequency component and the signal is modulated on the high frequency component of the alternating current passed through the electromagnetic induction circuit 130. The transmission of the signal is realized by extracting the modulated signal at the time the electrical power is converted from the magnetic field in the electromagnetic induction circuit on the card side. In this case, it will be possible to eliminate partially or completely the electrical contacts or the photo-semiconductor elements. However, it is not desirable to provide several electromagnetic induction circuits considering the problem of mutual interaction between the electromagnetic induction circuits. Because of this, the need will arise to send the signals time-sequentially. The above modulation function on the apparatus body portion can be realized by adding to the circuit 131 or by providing a separate circuit. Further, on the card side, it is possible to carry out the signal extraction in the circuit 121 or by providing a separate circuit. These techniques can be implemented easily because they are already available in the existing communication technology.

Embodiment 11

Figure 10:
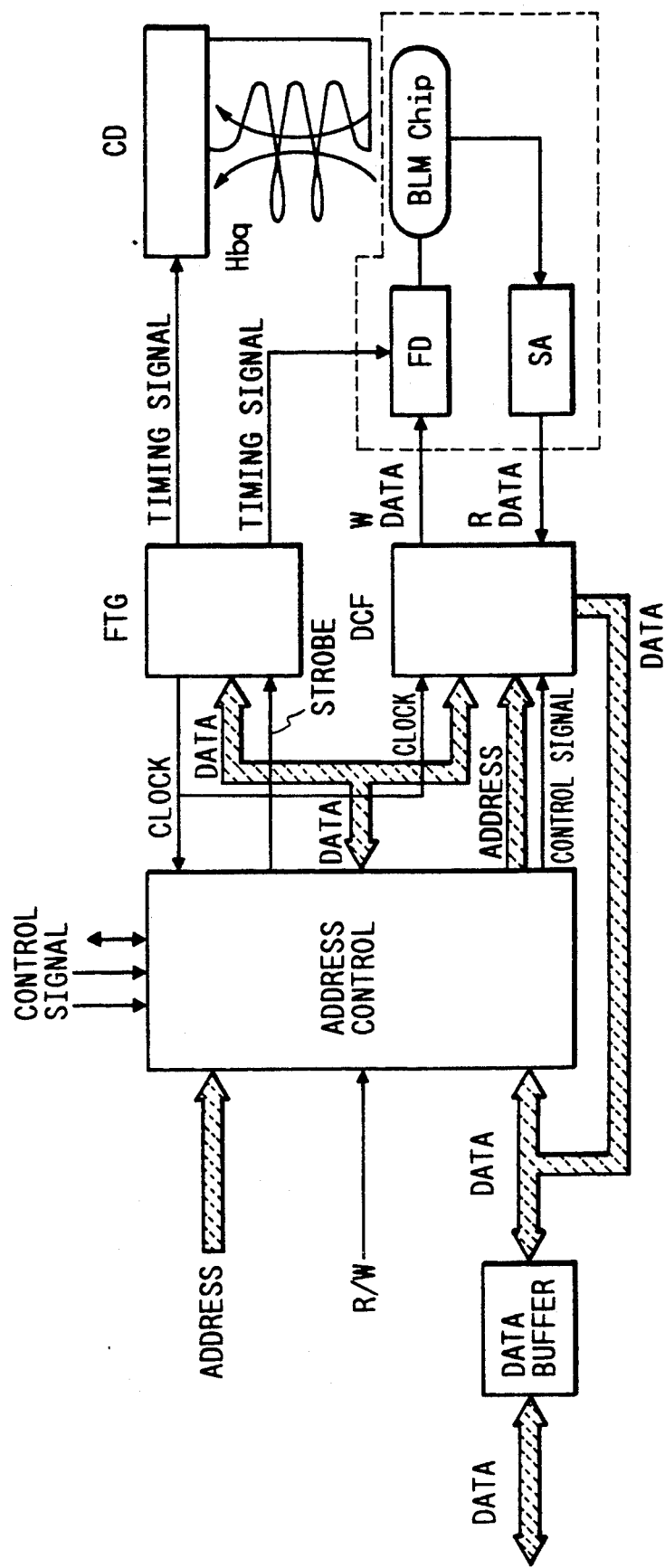
FIG. 10 is the circuit configuration diagram of the Bloch line memory device in another preferred embodiment of the present invention.

The basic block diagram of the Bloch line memory device was described earlier during the explanations of FIG. 3 and FIG. 6. In the following, further details of an example of the circuit configuration required for realizing these functions will be described using FIG. 10. Although the electrical power supply lines are not shown in this figure, it goes without saying that it is necessary to supply the electrical power required for operating these circuits.

The address signals, data signals, input/output signals, and control signals are exchanged with the external information processing equipment. The control signals include the READY signal for maintaining the external equipment in the waiting state until the read out information is transmitted, the POWER ON RESET signal for initializing the necessary functions at the time the power supply is switched ON, the PD signal for giving advance notice at the time the power supply is switched OFF, and the IRQ signal for controlling the interrupts between the equipment, etc. These signals are sent to the Bloch line memory controller BLMC. The processing of the defective loops within the memory element and the selection of the memory element corresponding to the address information are carried out in BLMC. The defective loop processing is a technology similar to that in the bubble memory technology and is a particularly important processing for improving the reliability of serial memory and for increasing the product yield. The data signals processed by BLMC are sent to FTG and DCF. The timings of operating the drive circuit and the functional section (gates) necessary for operating the memory element are calculated in FTG taking into consideration the strobe signal from BLMC, and the results of these calculations are sent to the coil driver CD and the function driver FD. The analog signals necessary for operating the functional section are generated in FD and sent to the memory element. The drive magnetic field Hbp is generated in CD. In DCF, the parallel data is converted into time-sequential data (serial to parallel conversion) from the data signals and the address signals. The resultant signal is sent to FD and the FD is operated correspondingly to the "1" information or the "0" information.

Further, FTG sends the clock signal to BLMC and DCF and operates them while synchronizing them.

During information read out, the address signal and the READ signal are input to BLMC. During the period that BLMC is reading out information, it sends the READY signal to the external equipment to inform it that the information is being read. Further, it is also possible to provide the means of sending the interrupt signal, etc., to inform that the reading of information has been completed. In BLMC, the address of the memory element is determined by sending signals to FTG and DCF in a manner similar to that during the writing operation. Thereafter, the read out signal is obtained by sending the analog signal to FD via the conductor of the functional section necessary for reading out.

The read out signal is sent to the sense amplifier SA where the signal is amplified to a level at which the necessary signal processing can be done in DCF. In DCF, the serial signal will be converted into parallel signal in a manner opposite to that during the writing operation. The data that has been so read out is sent from DCF to the data buffer from where it waits to be read out by the external equipment. BLMC waits for the duration of time necessary for DCF to process the data from the instant of time the address is determined and then informs the external equipment that the data read out has been completed by switching OFF the READY signal being sent to the external equipment.

The memory element, FD, and SA are mounted on the card substrate side. In this case, there is the advantage that the variations between different elements in the analog signal required for operating the memory elements can be absorbed by the adjustment of FD and SA. As a result, it is also possible to provide FD and SA on the side of the apparatus body portion by reducing the variations in the characteristics of the different memory elements.

Embodiment 12

The above preferred embodiment does not give sufficient considerations to the plurality of memory elements present in the card substrate. This was to avoid the explanations from becoming complex and not an inherent characteristic. Thus, the following describes the method used in the present invention for initiating a plurality of memory elements.

Figure 11:
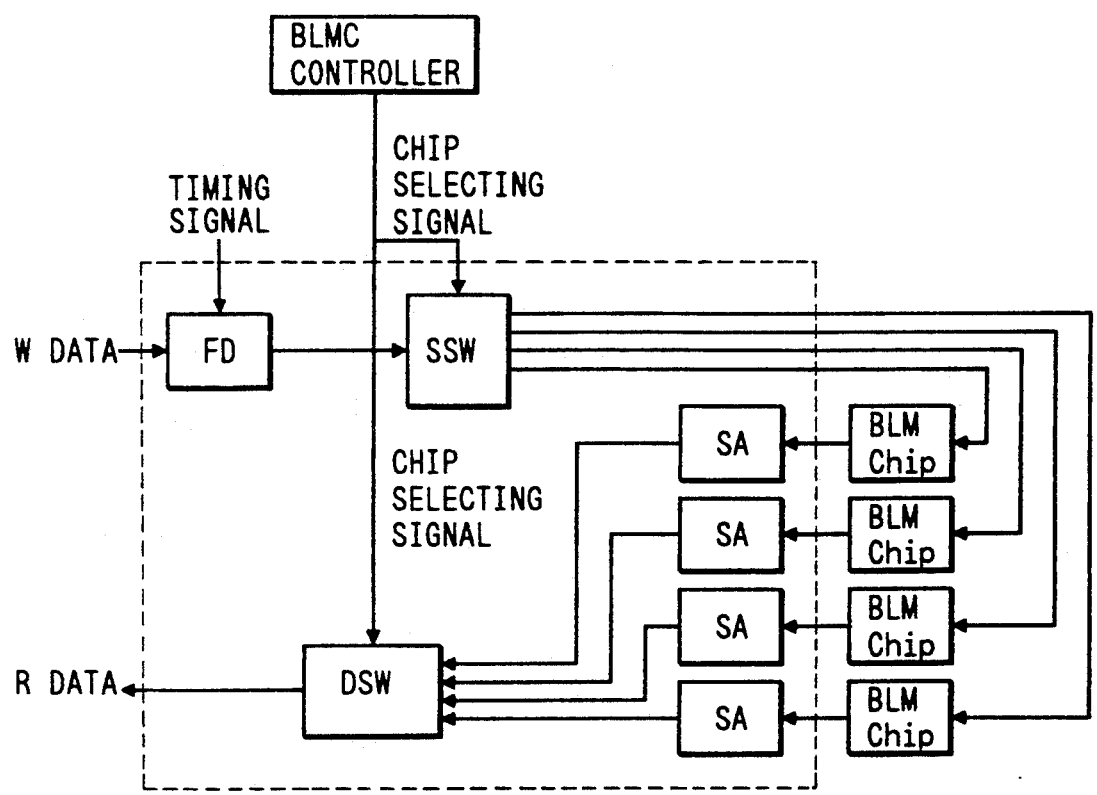
FIG. 11 is the circuit configuration diagram on the card side of the Bloch line memory device in another preferred embodiment of the present invention.

FIG. 11 shows the semiconductor circuit and the memory elements on the card substrate. The semiconductor circuit comprises SSW which selects the signals from FD, DSW which selects the read out signal, apart from the circuits FD and SA. A number of signal lines will be required when several memory elements are present in the same circuit substrate. It has already been explained that sending all these signals to the apparatus body portion is impossible considering the number of electrical contacts available. Because of this, in the present invention, the memory element to be driven is selected by BLMC based on the address signals, and the selection signals are sent to SSW and DSW. In SSW and DSW, based on these selection signals, the signal lines from FD and DCF are connected to the signal lines from the selected memory element. In this manner, it is possible to initiate a plurality of memory elements within a limited number of electrical contacts in the card substrate.

Embodiment 13

Figure 16A:
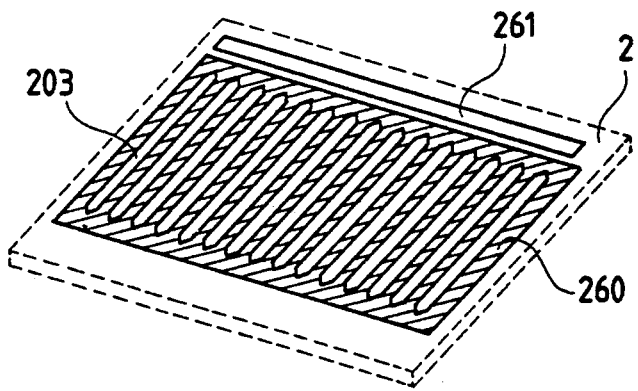
FIG. 16a and FIG. 16b are the schematic diagrams showing yet another memory element that can be mounted on the card type memory substrate in preferred embodiments of the present invention.
Figure 16B:
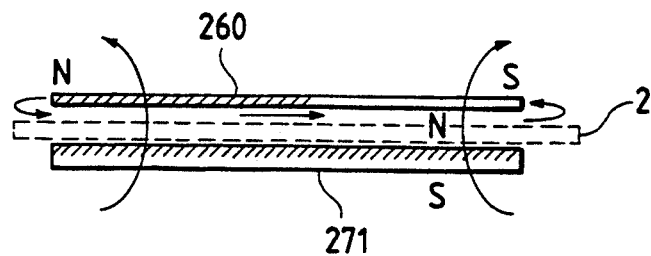

According to the present invention, it is possible to insert in and remove from the apparatus body portion the memory card substrate containing Bloch line memory elements. As a memory element configuration that permits the realization of such a card substrate has already been described above as the method of using the second groove pattern. The important factor for implementing the present invention is the thickness of the card. As another method of realizing this objective of the present invention, it is possible to provide a permanent magnet film directly on the memory element 2 as shown in FIG. 16a and FIG. 16b. In this figure, 203 is the stripe magnetic domain and 261 is the input/output control section. Further, 271 is the perpendicularly magnetized film and 260 is the longitudinally magnetized film. As is evident from the prior art, in order to maintain the information in the memory element, it is necessary to provide a magnetic field in the direction perpendicular to the surface of the memory element and a magnetic field in the direction longitudinal to the surface of the memory element. When these fields are generated using ferrite or other permanent magnets according to the conventional methods, it is not possible to make the elements thin due to the difficulty of manufacturing the permanent magnets. However, due to the advances in the recent years in the production of metal tapes and in the technology of perpendicular magnetic recording, materials have been developed that can provide very strong magnetic fields in the thin film state. These materials contain certain amounts of the transition metals such as Co, Ni, Fe, etc., and can be formed on the memory elements to thicknesses of about 1 to 3 mm using the film growth technology. As a result, it is possible to form film type memory elements that can be mounted on card type substrates. In this case, the second groove pattern will not be required.

By applying the technologies mentioned above it is possible to realize card type Bloch line memory devices. The likelihood is high of storing more than Gb amounts of information in a single element in the future in the case of Bloch line memories. Therefore, not only can they be used as the external storage devices for information processing equipment but also newer forms of utilization can be developed. Next, one such example will be described.

Embodiment 14

Figure 17:
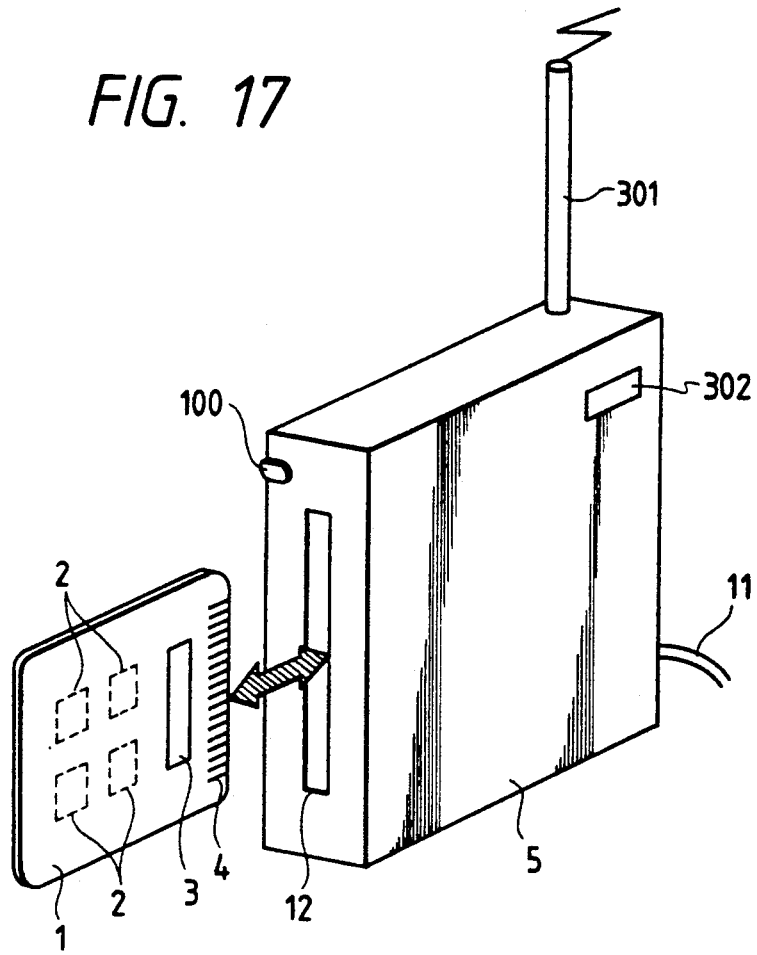
FIG. 17 is the outline diagram for explaining the apparatus in another preferred embodiment of the present invention in which broadcast reception and memory functions have been added.

FIG. 17 shows a Bloch line memory card and the apparatus body portion with card insertion portion. The difference is that the apparatus body portion is provided with the function of broadcast and other reception, etc. In particular, the antenna 301 and the reception circuit 302 have been provided. In the reception circuit 302 are provided the circuits that offer the total freedom of using as required the register functions, timer functions, etc., apart from the circuits of detectors (demodulators), amplifiers, analog to digital converters, etc. The reception circuit is connected to the Bloch line memory controller 7. As a result, it is possible to store the received data from the reception circuit in the Bloch line memory card 1 via the controller.

Considering the memory capacity of the Bloch line memory devices, it is possible to store from several hours to several hundred hours of audio information and to store several hours of video information. The stored information can be read out from the apparatus body portion according to the need and can be reproduced from the information processing equipment connected externally thereby permitting the storing of broadcast information without having to use recording tapes or video tapes.

In order to reproduce the stored data, it is necessary to convert the digital data into a signal form in which the externally connected information processing equipment can receive the data. It is necessary to add this function to the apparatus body portion 5. Of course, with the advances in the digitalization of the information processing equipment, the need for this function may also disappear. Further, the antenna is required for receiving the wireless information and will not be required when receiving cable broadcasts or wire communication. In this case, it is sufficient to provide only the reception circuit in the apparatus body portion and to send the received signal to the controller of the Bloch line memory elements.

The above described selection and control, etc., of the information can also be done by the switches, etc., provided on the control console of the externally connected information processing equipment. This operation can be realized easily by the technology equivalent to that of the conventional information processing equipment.

Embodiment 15

Figure 20:
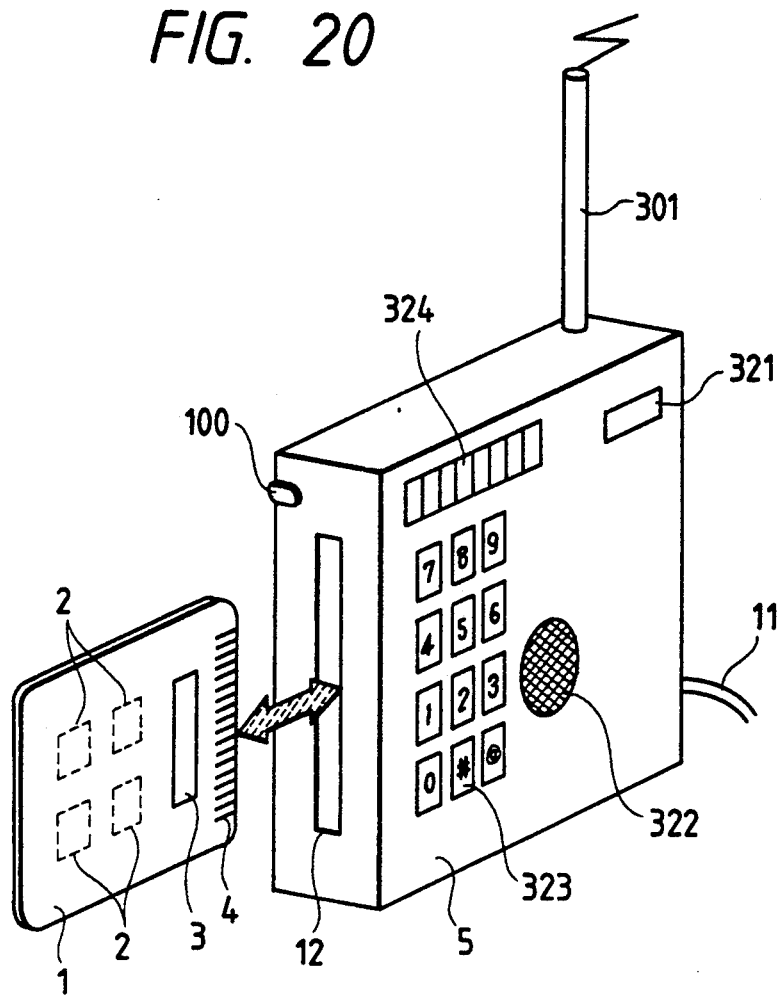
FIG. 20 is the outline diagram for explaining the audio reproduction device to which broadcast reception and memory functions have been added in another preferred embodiment of the present invention, and, FIG. 21 is the outline plan view for explaining the reproduction device to which memory and reproduction functions and audio reproduction function have been added in another preferred embodiment of the present invention.

Further, as shown in FIG. 20, by providing additionally in the memory apparatus body portion a speaker 322, a selection switch 323, and a status display portion 324, it is also possible to reproduce the required audio information in the condition in which the apparatus is not connected to an external amplifier or speaker system. In order to realize this, it is necessary to provide additionally an amplifier circuit to drive the speaker, apart from the reception circuit 321 inside the apparatus body portion 5. Using this function, it is possible to build into the apparatus body portion the functions of a radio and a tape recorder.

Embodiment 16

Figure 21:
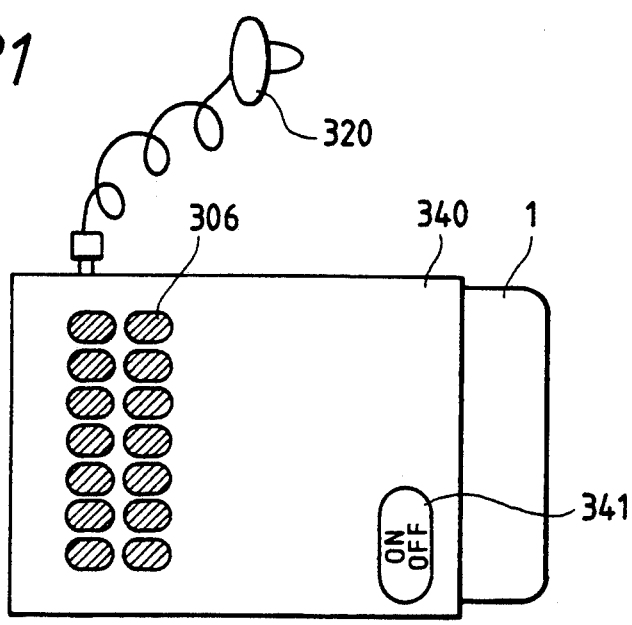

Further, as shown in FIG. 21, it will be possible to output the recorded audio information in an earphone system 320 by connecting the card substrate 1 to a special purpose equipment 340 that has the audio reproduction circuit. According to this, it will be possible to reproduce the recorded audio information from the apparatus body portion if only the special purpose reproduction equipment is carried. In order to realize this function, it is necessary to provide the switch 306 for selecting the recorded audio information to be reproduced in the special purpose reproduction equipment 340. The switch drives the controller added to the equipment and carries out the selection of the memory element and determines the address information. Further, it is possible to improve the portability of the special purpose reproduction equipment by providing a battery in the special purpose reproduction equipment 340. Further, the life of the battery is extended by providing the switch 341.

Embodiment 17

Figure 18:
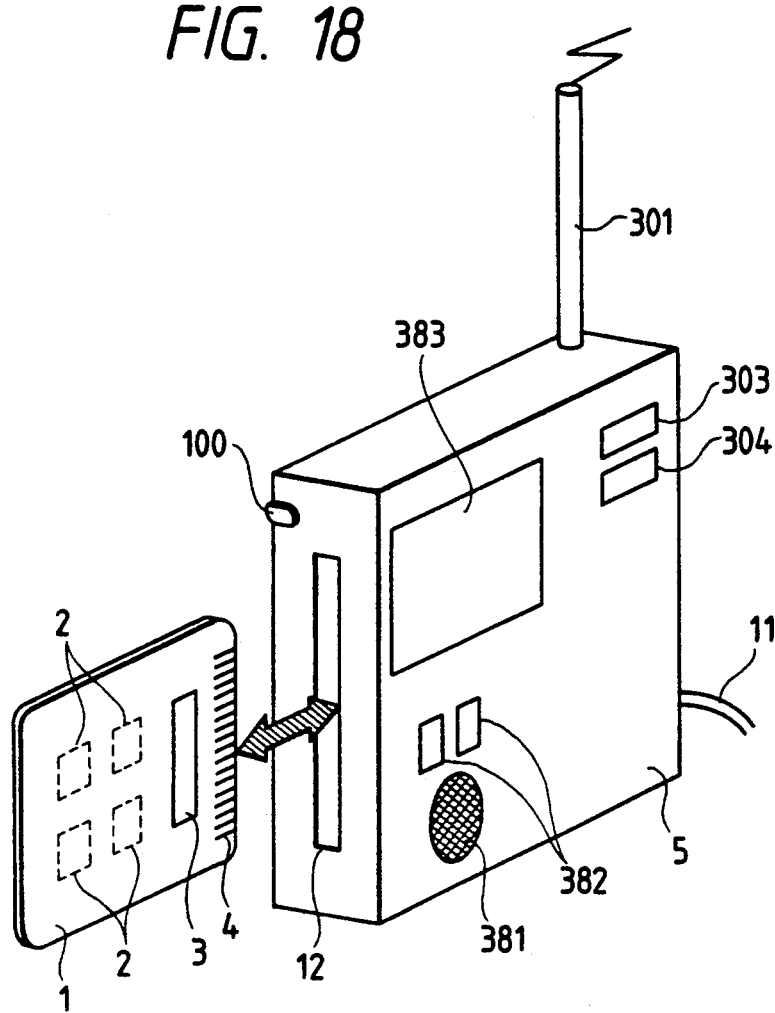
FIG. 18 is the outline diagram for explaining the image and character information reproduction device to which broadcast reception and memory functions have been added in another preferred embodiment of the present invention.

Further, apart from audio information, it is also possible to output video and character information. In order to realize this function, it is necessary to provide the display function portion 383 in the apparatus body portion, a special purpose control circuit 303, and the display driver portion 304 as shown in FIG. 18. This can be achieved easily by applying the technology that is being used in portable televisions and portable computers. The numeral 381 denotes a speaker and the numeral 382 denotes a selection switch.

Embodiment 18

Figure 19:
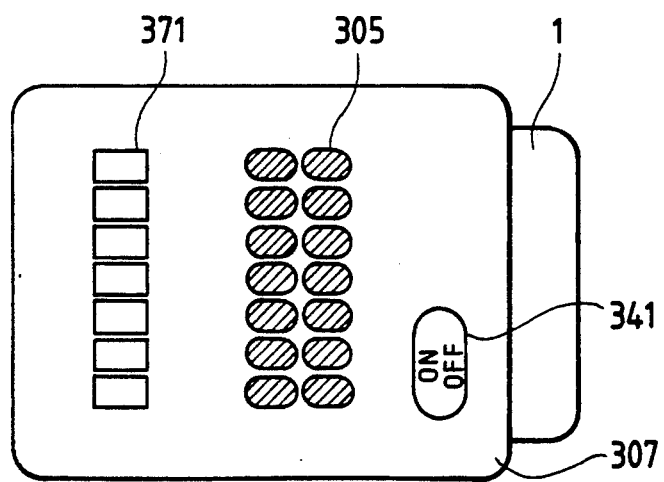
FIG. 19 is the outline plan view for explaining the reproduction device to which memory and reproduction functions and character information reproduction function have been added in another preferred embodiment of the present invention.

Further, as shown in FIG. 19, it is possible to realize functions similar to the above preferred embodiment of the present invention by inserting the card type memory 1 in a special purpose character reproduction display equipment 307 having an image reproduction function 371 and a selection switch 305.

The compound type information processing equipment not necessarily restricted to the external information processing equipment described in the above preferred embodiments are appropriately suitable for the recent information distribution systems (as described in pages 116–136 of Nikkei Electronics Magazine of Nov. 26, 1990). In concrete terms, by installing the memory apparatus body portion in the information retail sales outlets, the customers can purchase the information of their choice by simply inserting their personal cards in the apparatus body portion. The customers can reproduce or utilize otherwise the information they have so purchased in their own reproduction equipment. Thus, since the conventional paper, plastic disks, or tapes are not used for the distribution of information, the present invention is very effective in environmental protection and saving of natural resources.

According to the present invention, it is possible to realize at a low cost a memory equipment with a large storage capacity that can be easily inserted and removed from the information processing equipment. The production can be done at a low cost because the product according to the present invention does not have the drive system in the circuit substrate (the substrate that can be inserted and removed easily) as compared to a Bloch line memory apparatus of the prior art. Since the circuit substrate becomes cheap in cost, the users can possess a number of circuit substrates. The storage capacity can be increased without limit because substrates storing different information can be inserted selectively in the same apparatus body portion.

Further, according to the present invention, it is possible to realize information processing equipment suitable for new information distribution methods because the present invention enhances the broad applicability of Bloch line memory devices.

what is claimed is:

1. An information recording and reproducing apparatus comprising:
   i) a card-like memory module including a memory element which is formed on a circuit substrate and which comprises:
      a) a magnetic garnet film having an easy magnetization axis almost perpendicular to the main surface of said magnetic garnet film,
      b) a plurality of first patterns which are arranged on said magnetic garnet film and each of which serves as a core to maintain a magnetic domain, said magnetic domain having a magnetic domain wall in which Bloch lines occur as information carriers, and
      c) a plurality of second patterns which are arranged on said magnetic garnet film so as to sandwich every said magnetic domain maintained by said first patterns between said second patterns, which are longer in length than said first patterns, and each width of which is made larger at the end portion of said second pattern than at another portion thereof, and
   ii) drive means for reading and writing information by driving said memory element in said memory module magnetically, wherein said memory module and said drive means can be attached to and detached from each other.

2. An information recording and reproducing apparatus according to claim 1, in which there is a connection means for exchanging signals or electrical power between said memory module and said drive means.

3. An information recording and reproducing apparatus according to claim 2, in which said connection means comprises electrical contacts provided in said memory module and said drive means.

4. An information recording and reproducing apparatus according to claim 2, in which said connection means comprises light receiving and light emitting elements provided in said memory module and said drive means.

5. An information recording and reproducing apparatus according to claim 2, in which said connection means comprises electromagnetic induction circuits provided in said memory module and said drive means.

6. An information recording and reproducing apparatus according to claim 2 in which said connection means comprises wireless transceivers provided in said memory module and said drive means.

7. An information recording and reproducing apparatus according to claim 1, in which said memory module and said drive means have electromagnetic induction circuits for power supply.

8. An information recording and reproducing apparatus according to claim 1, in which said memory module has an external shape of a card.

9. An information and reproducing apparatus according to claim 8, in which said external shape of a card has dimensions of thickness of 1 mm to 10 mm, length of approximately 86 mm, and width of approximately 54 mm.

10. An information recording and reproducing apparatus according to claim 1, in which said memory module comprises a memory portion which records information by a presence or absence of Bloch lines, and a semiconductor circuit portion for outputting to said memory portion signals necessary for the writing or the reading.

11. An information recording and reproducing apparatus according to claim 10, in which said memory portion has a plurality of signal lines, and said semiconductor circuit portion has a means for selecting therefrom.

12. An information recording and reproducing apparatus according to claim 10, in which said connection means carries out the input and output of the data regarding address information of said memory portion and the memory control signals for a semiconductor circuit portion between said memory module and said drive means.

13. An information recording and reproducing apparatus according to claim 1, in which said memory module further includes a magnetic shielding means for shielding said memory element when said memory module is detached from said driving means and for exposing said memory element to a drive magnetic field generated in said driving means when said memory module is attached to said driving means.

14. An information recording and reproducing apparatus according to claim 1, in which said memory module comprises a memory portion which records information by a presence or absence of Bloch lines, and a linear raised ferrite portion for concentrating a magnetic field for driving said memory portion at a position where said linear raised ferrite portion at least overlaps said memory portion.

15. An information recording and reproducing apparatus according to claim 1, in which said first and second patterns are a groove patterns formed by etching said magnetic garnet film.

16. An information recording and reproducing apparatus according to claim 1, in which said first and second patterns are a magnetic material patterns provided on top of said magnetic garnet film.

17. An information recording and reproducing apparatus according to claim 1, in which said first and second patterns are a non-magnetic material patterns formed within said magnetic garnet film.

18. An information recording and reproducing apparatus according to claim 1, in which said drive means comprises a display means for outputting information stored in said memory module in a visible form.

19. An information recording and reproducing apparatus according to claim 1, in which said drive means comprises an audio output means for outputting information stored in said memory module in a visible form.

20. An information recording and reproducing apparatus according to claim 1 further comprising a connectable and disconnectable memory means that uses the Bloch lines occurring in the magnetic domain wall at boundaries of magnetic domains as an information medium, a selection circuit for selecting required information, a digital to analog conversion circuit that converts information stored as a digital information in said memory means into analog information, an amplifier circuit that amplifies the output of said digital to analog conversion circuit, and an audio reproduction circuit that reproduces the output of said amplifier as sound.

21. An information recording and reproducing apparatus according to claim 1 further comprising a connectable and disconnectable memory means that uses Bloch lines occurring in the magnetic domain wall at boundaries of magnetic domains as an information medium, a selection circuit for selecting required information, a digital to analog conversion circuit that converts the information stored as digital information in said memory means into analog information, an amplifier circuit that amplifies the output of said digital to analog conversion circuit, and a video reproduction circuit that reproduces the output of said amplifier in a visible form.

22. An information recording and reproducing apparatus according to claim 1, in which said second patterns prevent said magnetic domains from stretching when the perpendicular magnetization applied on said magnetic garnet film is in the range of $-100$ to $100$ oersteds.

23. An information recording and reproducing apparatus comprising:
   i) a card-like memory module including a memory element which is formed on a circuit substrate and which comprises:
      a) a magnetic garnet film having an easy magnetization axis almost perpendicular to the main surface of said magnetic garnet film,
      b) a plurality of first patterns which are arranged on said magnetic garnet film and each of which serves as a core to maintain a magnetic domain, said magnetic domain having a magnetic domain wall in which Bloch lines occur as information carriers, and
      c) a perpendicularly magnetized film laminated on an information storing portion of said magnetic garnet film for preventing said magnetic domain from stretching by the magnetization of said magnetized film, and
   ii) drive means for reading and writing information by driving said memory element in said memory module magnetically, wherein said memory module and said drive means can be attached to and detached from each other.

24. An information recording and reproducing apparatus comprising:
   i) a card-like memory module including a memory element which is formed on a circuit substrate and which comprises:
      a) a magnetic garnet film having an easy magnetization axis almost perpendicular to the main surface of said magnetic garnet film,
      b) a plurality of first patterns which are arranged on said magnetic garnet film and each of which serves as a core to maintain a magnetic domain, said magnetic domain having a magnetic domain wall in which Bloch lines occur as information carriers, and c) a longitudinally magnetized film laminated on an information storing portion of said magnetic garnet film for maintaining each position of said Bloch lines occurring in said magnetic domain wall by the magnetization of said magnetized film, and ii) drive means for reading and writing information by driving said memory element in said memory module magnetically, wherein said memory module and said drive means can be attached to and detached from each other.

* * * * *

UNITED STATES PATENT AND TRADEMARK OFFICE
CERTIFICATE OF CORRECTION

PATENT NO. : 5,327,371
DATED : July 5, 1994
INVENTOR(S) : Yooji Maruyama, et al.

It is certified that error appears in the above-indentified patent and that said Letters Patent is hereby corrected as shown below:

Claim 9, column 27, line 8, after "information" insert --recording--.

Signed and Sealed this

Thirtieth Day of August, 1994

Attest:

BRUCE LEHMAN

*Attesting Officer*     *Commissioner of Patents and Trademarks*